United States Patent
Sasago et al.

(10) Patent No.: US 11,362,231 B2
(45) Date of Patent: Jun. 14, 2022

(54) LIGHT DETECTION APPARATUS AND LIGHT DETECTION SYSTEM

(71) Applicant: CANON KABUSHIKI KAISHA, Tokyo (JP)

(72) Inventors: Tomoya Sasago, Kawasaki (JP); Junji Iwata, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 317 days.

(21) Appl. No.: 16/571,463

(22) Filed: Sep. 16, 2019

(65) Prior Publication Data
US 2020/0105958 A1 Apr. 2, 2020

(30) Foreign Application Priority Data

Sep. 28, 2018 (JP) .............................. JP2018-185431

(51) Int. Cl.
| | |
|---|---|
| H01L 31/107 | (2006.01) |
| G01S 7/486 | (2020.01) |
| H01L 31/16 | (2006.01) |
| H01L 27/146 | (2006.01) |

(52) U.S. Cl.
CPC ............ *H01L 31/107* (2013.01); *G01S 7/486* (2013.01); *H01L 27/14643* (2013.01); *H01L 31/16* (2013.01)

(58) Field of Classification Search
CPC .............. H01L 31/107; G01J 2001/442; G01J 2001/4466
See application file for complete search history.

(56) References Cited

U.S. PATENT DOCUMENTS

| | | | |
|---|---|---|---|
| 2009/0184384 A1 | 7/2009 | Sanfilippo | |
| 2016/0349371 A1* | 12/2016 | Suzuki | .................. G01S 17/931 |
| 2017/0307759 A1* | 10/2017 | Pei | ............................. G06T 7/70 |
| 2018/0108800 A1 | 4/2018 | Morimoto | |
| 2018/0136340 A1* | 5/2018 | Nelson | ................. A61B 6/4241 |

FOREIGN PATENT DOCUMENTS

| | | | |
|---|---|---|---|
| JP | 4-256376 A | | 9/1992 |
| JP | 09148618 A | * | 6/1997 |
| JP | 2018-64086 A | | 4/2018 |

* cited by examiner

*Primary Examiner* — Thanh Luu
(74) *Attorney, Agent, or Firm* — Canon U.S.A., Inc. IP Division

(57) ABSTRACT

An avalanche diode includes a first semiconductor region of a first conductivity type disposed in a first depth, a second semiconductor region disposed in a second depth deeper than the first depth with respect to a first surface, in contact with the first semiconductor region, and a third semiconductor region disposed in a third depth deeper than the second depth with respect to the first surface, in contact with the second semiconductor region. Avalanche multiplication is caused by the first and third semiconductor regions. The first, second, and third semiconductor regions overlap in plan view. A potential difference between the first and second semiconductor regions with respect to main charge carriers of a semiconductor region of the first conductive type is smaller than a potential difference between the first and third semiconductor regions with respect to the charge carriers.

12 Claims, 24 Drawing Sheets

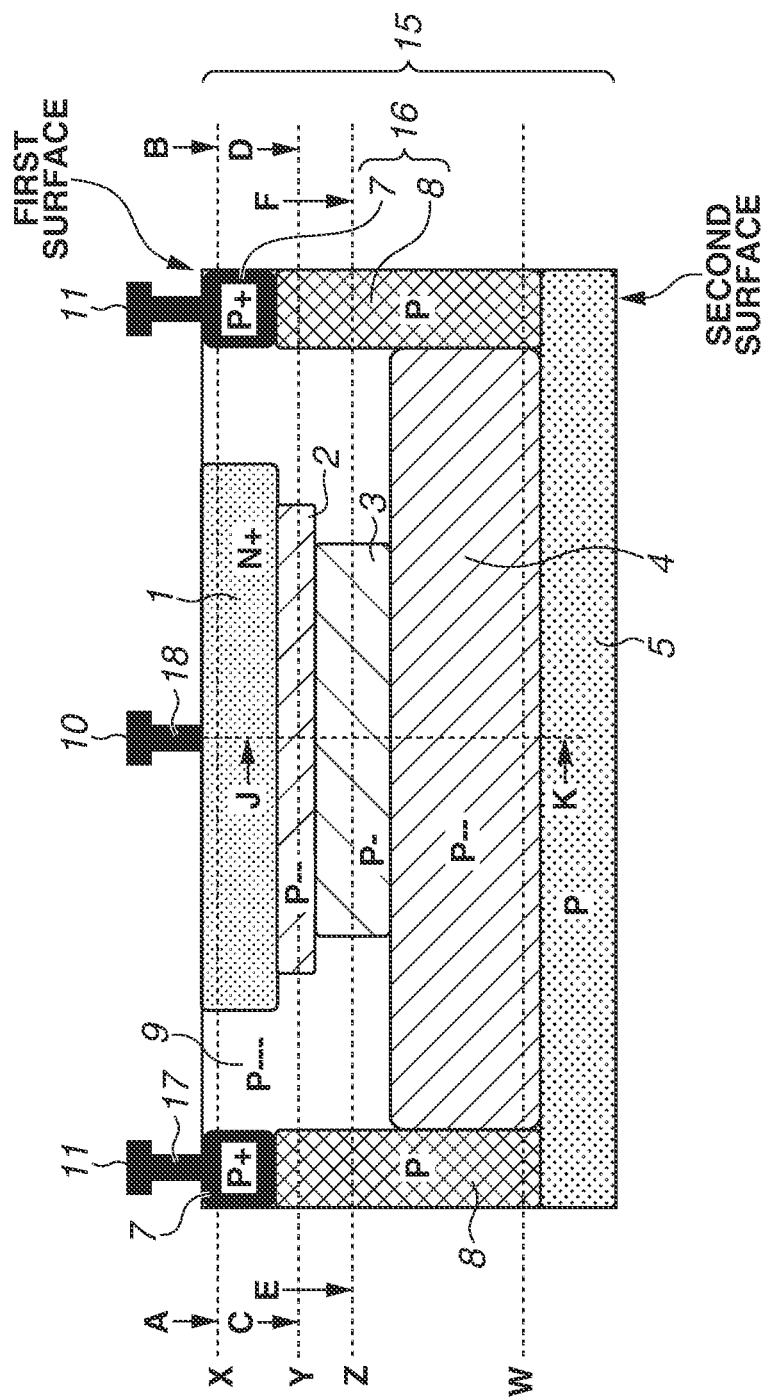

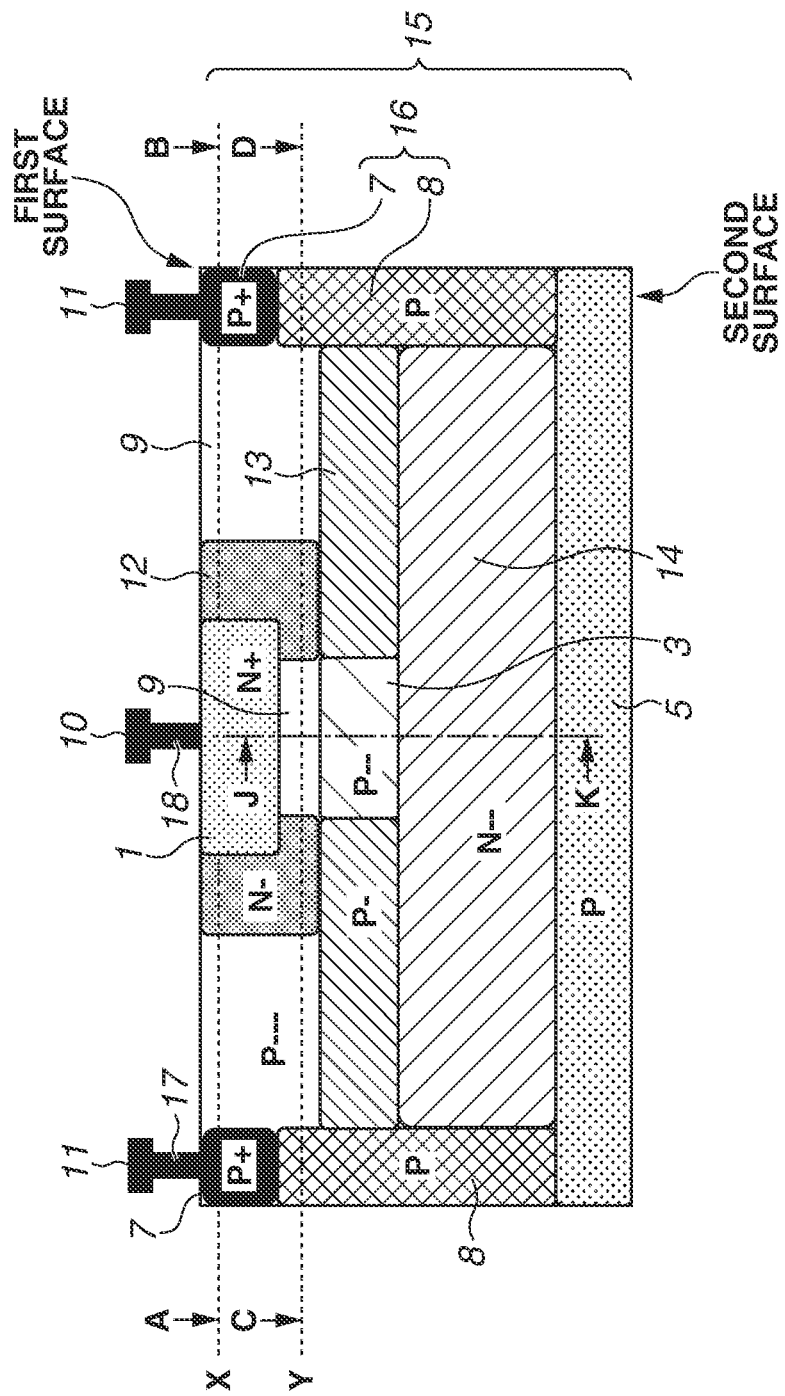

LIGHT DETECTION APPARATUS AND LIGHT DETECTION SYSTEM

BACKGROUND

Field

The present disclosure relates to a light detection apparatus for performing photoelectric conversion and a light detection system.

Description of the Related Art

Conventionally, a light detection apparatus is known to be capable of detecting feeble light at a single photon level using avalanche multiplication.

United States Patent Application Publication No. 2009/0184384 discusses a Single Photon Avalanche Diode (SPAD) in which photocarriers resulting from single photons cause avalanche multiplication in a PN junction region in semiconductor regions forming a photoelectric conversion portion.

The SPAD discussed in United States Patent Application Publication No. 2009/0184384 includes a P-type semiconductor region disposed on the front surface of a semiconductor substrate, and an N-type semiconductor region disposed under the P-type semiconductor region. The P-type and N-type semiconductor regions form a PN junction which is applied with a reverse bias voltage for causing avalanche multiplication.

SUMMARY

According to an aspect of the present disclosure, a light detection apparatus includes a semiconductor substrate having a first surface, and having a second surface facing the first surface, and a pixel unit including a plurality of pixels disposed on the semiconductor substrate, each pixel including an avalanche diode. The avalanche diode includes a first semiconductor region of a first conductivity type disposed in a first depth, a second semiconductor region disposed in a second depth deeper than the first depth with respect to the first surface, in contact with the first semiconductor region, and a third semiconductor region disposed in a third depth deeper than the second depth with respect to the first surface, in contact with the second semiconductor region. The avalanche diode causes avalanche multiplication by the first and third semiconductor regions. The first, second, and third semiconductor regions have overlapped portions in a plan view. A difference in potential height between the first and second semiconductor regions with respect to main carrier electric charges of a semiconductor region of the first conductive type is smaller than a difference in potential height between the first and third semiconductor regions with respect to the carrier electric charges.

Further features of the present disclosure will become apparent from the following description of exemplary embodiments with reference to the attached drawings.

BRIEF DESCRIPTION OF THE DRAWINGS

FIG. 4 is a cross-sectional view illustrating an avalanche diode.

FIG. 16 is a cross-sectional view illustrating an avalanche diode.

DESCRIPTION OF THE EMBODIMENTS

In a Single Photon Avalanche Diode (SPAD) discussed in United States Patent Application Publication No. 2009-0184384, a region subjected to electric charge detection is a PN junction region. Since a strong electric field arises in the region subjected to electric charge detection, the tunneling effect may arise in the PN junction by the strong electric field. Electric charges generated by the tunneling effect are detected as a pseudo signal in the region subjected to electric charge detection, and the pseudo signal may possibly become noise. The number of electric charges generated by the tunneling effect exponentially increases depending on the electric field in the PN junction region.

On the other hand, lowering the impurity density of the P-type region for forming a PN junction region enables reducing the electric field in the PN junction region, thus reducing electric charges generated by the tunneling effect. However, lowering the impurity density of the P-type region rises the operating voltage for causing avalanche multiplication.

The following technique relates to a light detection apparatus for reducing noise while preventing the rise of the operating voltage for avalanche multiplication, and to a photoelectric conversion system.

The light detection apparatus according to each exemplary embodiment will be described below with reference to the accompanying drawings. The conductivity type of a transistor according to the following exemplary embodiment is to be considered as an example and is not limited to the conductivity type according to the exemplary embodiment. The conductivity type according to the exemplary embodiment can be suitably changed. If the conductivity type is changed, the potentials of the gate, source, and drain of the transistor may be suitably changed. For example, in a case where the transistor is operated as a switch, the low and high levels of the potential supplied to the gate may be reversed for the descriptions according to the exemplary embodiments.

A light detection apparatus according to a first exemplary embodiment of the present disclosure will be described below with reference to FIGS. 1 to 7.

Figure 1:
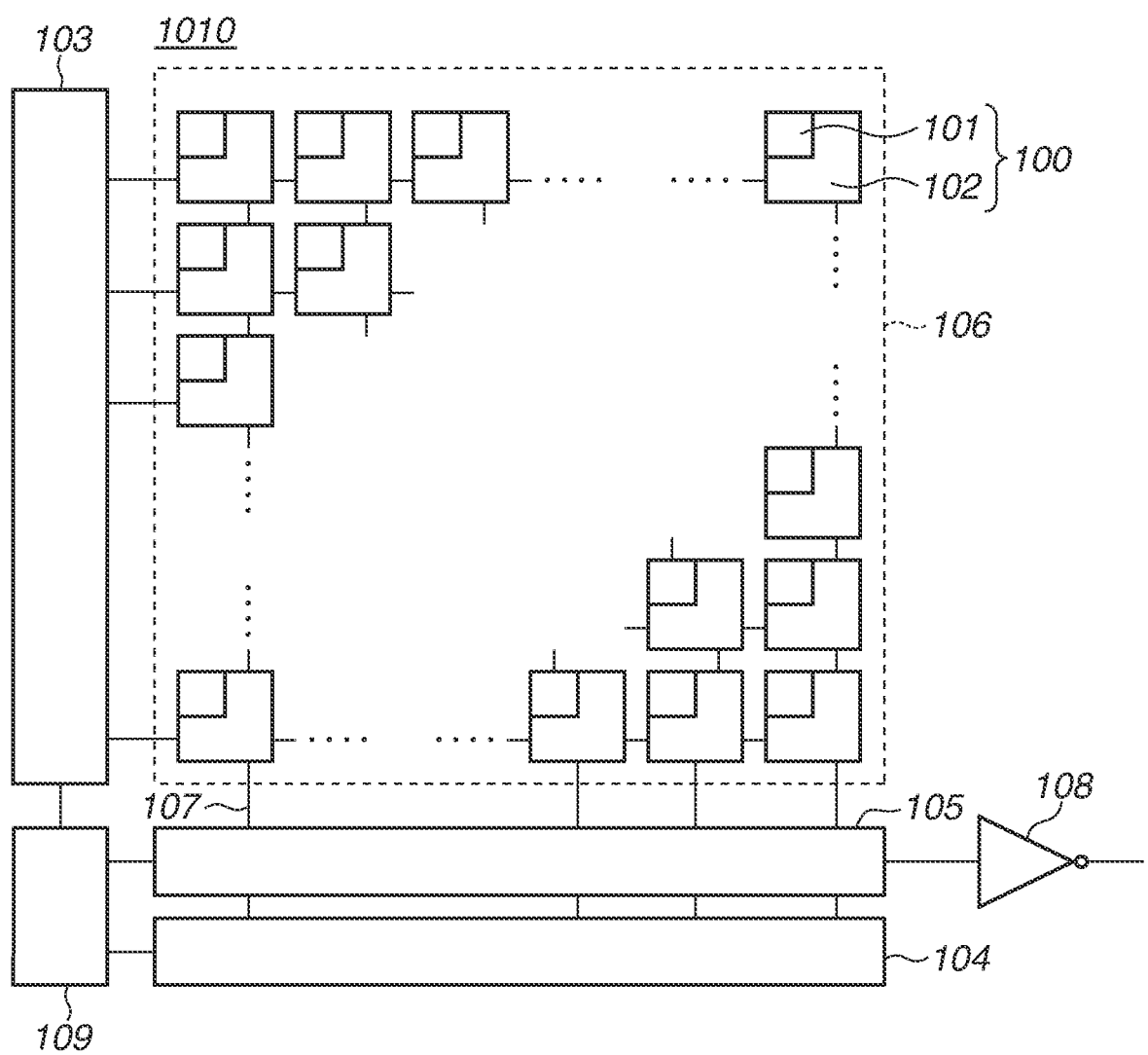
FIG. 1 illustrates a configuration of a light detection apparatus.

FIG. 1 is a block diagram illustrating a light detection apparatus 1010 according to the present exemplary embodiment. The light detection apparatus 1010 includes a pixel unit 106, a control pulse generation unit 109, a horizontal scanning circuit unit 104, a column circuit 105, a signal line 107, and a vertical scanning circuit unit 103.

The pixel unit 106 includes a plurality of pixels 100 arranged in a matrix form. One pixel 100 includes a photoelectric conversion element 101 and a pixel signal processing portion 102. The photoelectric conversion element 101 converts light into an electrical signal. The pixel signal processing portion 102 outputs the electrical signal after the conversion to the column circuit 105.

The vertical scanning circuit unit 103 receives a control pulse supplied from the control pulse generation unit 109 and supplies the control pulse to each pixel 100. Logic circuits, such as a shift register and an address decoder, are used as the vertical scanning circuit unit 103.

The signal line 107 supplies the signal output from a pixel 100 selected by the vertical scanning circuit unit 103 to the circuit in the subsequent stage of the pixel 100, as a potential signal.

The column circuit 105 inputs the signal from each pixel 100 via the signal line 107 and performs predetermined processing. The predetermined processing includes processing for noise elimination, amplification, and signal correction performed on the input signal to convert it into a format for output to the outside of a sensor. For example, the column circuit 105 includes a parallel-to-serial conversion circuit.

The horizontal scanning circuit unit 104 supplies to the column circuit 105 a control pulse for sequentially outputting the signal processed by the column circuit 105 to an output circuit 108.

The output circuit 108 including a buffer amplifier and a differential amplifier outputs the signal output from the column circuit 105 to a recording unit or a signal processing unit of the outside of the light detection apparatus 1010.

Referring to FIG. 1, the array of the pixels 100 in the pixel unit 106 may be one-dimensionally disposed or may include only a single pixel. In the pixel unit 106, a plurality of pixel columns may be divided into blocks. The vertical scanning circuit unit 103, the horizontal scanning circuit unit 104, and the column circuit 105 may be disposed in block units or for each pixel column.

The function of the pixel signal processing portion 102 does not need to be provided in all of pixels 100. For example, the one pixel signal processing portion 102 may be shared by a plurality of the pixels 100 and sequentially perform signal processing on the pixels 100. To increase the aperture ratio of the photoelectric conversion element 101, the pixel signal processing portion 102 may be provided on a semiconductor substrate different from the semiconductor substrate with the photoelectric conversion elements 101 formed thereon. In this case, the photoelectric conversion element 101 and the pixel signal processing portion 102 are electrically connected with each other via a connection wiring provided in each pixel. The vertical scanning circuit unit 103, the horizontal scanning circuit unit 104, the signal line 107, and the column circuit 105 may also be provided on a semiconductor substrate different from the semiconductor substrate with the photoelectric conversion elements 101 formed thereon, as described above.

Figure 2:
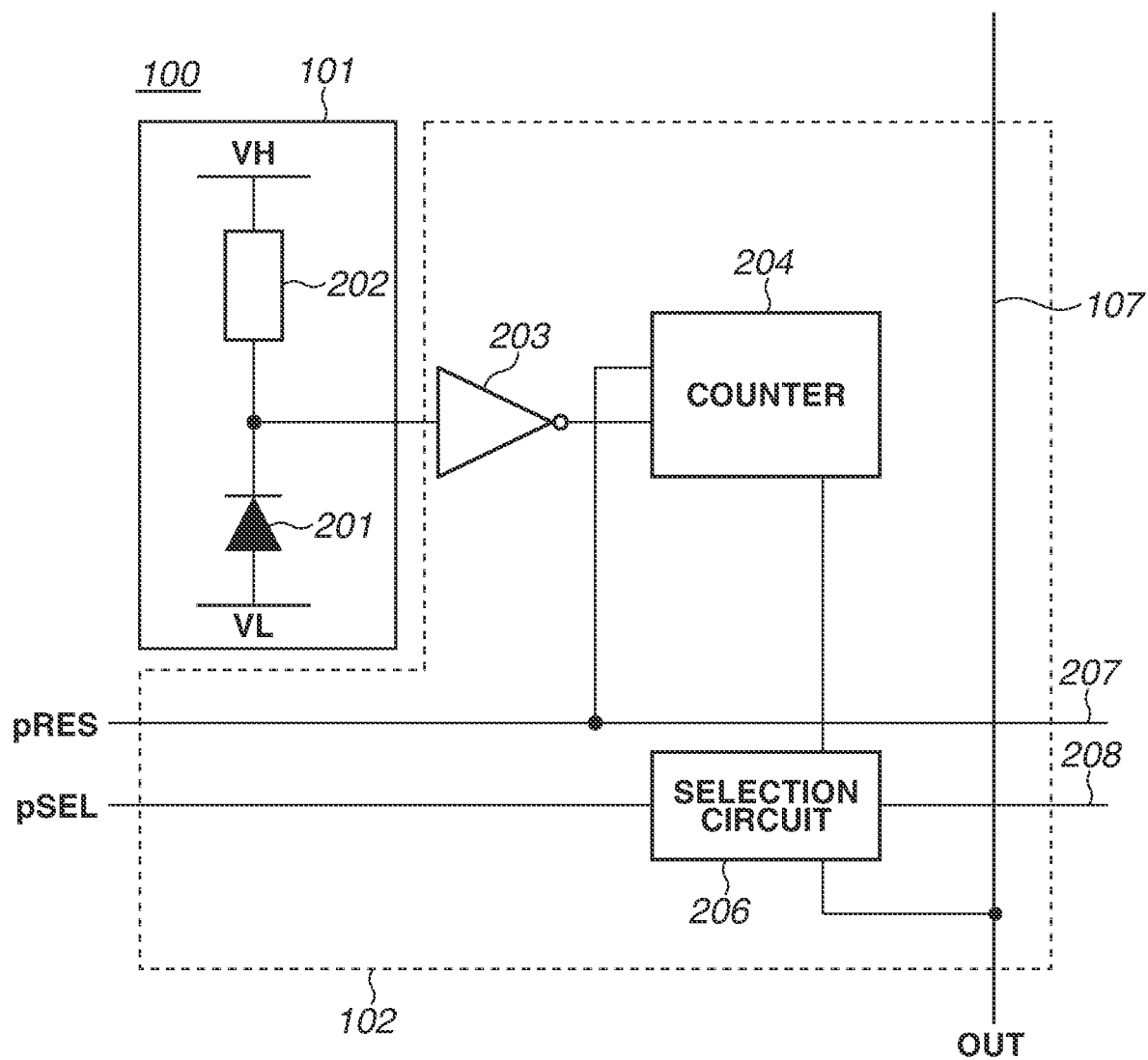
FIG. 2 illustrates a configuration of a pixel.

FIG. 2 illustrates an example of a block diagram of a pixel 100 including an equivalent circuit according to the present exemplary embodiment. Referring to FIG. 2, each pixel 100 includes the photoelectric conversion element 101 and the pixel signal processing portion 102.

The photoelectric conversion element 101 includes a photoelectric conversion portion 201 and a control portion 202.

The photoelectric conversion portion 201 generates electric charge pairs according to incidence light through the photoelectric conversion. An avalanche diode is used as the photoelectric conversion portion 201.

The cathode of the photoelectric conversion portion 201 is supplied with a potential based on a potential VH higher than a potential VL supplied to the anode thereof. The anode and the cathode of the photoelectric conversion portion 201 are supplied with potentials with reverse bias voltages so that the photoelectric conversion portion 201 functions as an avalanche diode. By performing the photoelectric conversion in a state where potentials with reverse bias voltages are supplied, electric charges generated by the incidence light cause the avalanche multiplication, and accordingly an avalanche current is generated.

When potentials with reverse bias voltages are supplied, if the potential difference between the anode and the cathode is larger than a breakdown voltage, the avalanche diode performs a Geiger mode operation. The SPAD is a photodiode for performing high-speed detection of a feeble signal at a single photon level by using the Geiger mode operation.

When the potential difference between the anode and the cathode of the photoelectric conversion portion 201 is equal to or larger than the potential difference, at which electric charges generated in the photoelectric conversion portion 201 cause the avalanche multiplication, and is equal to or less than the breakdown voltage, the avalanche diode enters the linear mode. An avalanche diode for performing light detection in the linear mode is referred to as an avalanche photo-diode (APD). According to the present exemplary embodiment, the photoelectric conversion portion 201 may operate as the avalanche diode operating in whichever mode. The potential difference which causes the avalanche multiplication will be described below.

The control portion 202 is connected with the power voltage for supplying the high potential VH and the photoelectric conversion portion 201. The control portion 202 has a function of replacing the variation of the avalanche current generated in the photoelectric conversion portion 201 with a voltage signal. The control portion 202 also functions as a load circuit (quench circuit) at the time of signal multiplication by the avalanche multiplication, and has a function of restricting the avalanche multiplication (quench operation) by restricting the voltage supplied to the photoelectric conversion portion 201. Examples of the control portion 202 include a resistive element and an active quench circuit for actively restricting the avalanche multiplication by detecting the increase in the avalanche current and performing feedback control.

The pixel signal processing portion 102 includes a waveform shaping portion 203, a counter circuit 204, and a selection circuit 206. The waveform shaping portion 203 shapes a voltage variation obtained when a photon level signal is detected and outputs a pulse signal. For example, an inverter circuit is used as the waveform shaping portion 203. Although an inverter is used as the waveform shaping portion 203, a circuit composed of a plurality of inverters in series connection or another circuit having the waveform shaping effect is also applicable.

A pulse signal output from the waveform shaping portion 203 is counted by the counter circuit 204. In the case of an N-bit counter (N is a positive integer), for example, the counter circuit 204 can count a single photon pulse signal for up to about the N-th power of 2. The counted signal is stored as a detected signal. When a control pulse pRES is supplied via a drive line 207, the detected signal stored in the counter circuit 204 is reset.

The selection circuit 206 is supplied with a control pulse pSEL from the vertical scanning circuit unit 103 (FIG. 1) via the drive line 208, and selects electrical connection and disconnection between the counter circuit 204 and the signal line 107. For example, a transistor or a buffer circuit for outputting a signal to the outside of the pixel is used as the selection circuit 206.

There may be provided a switch, such as a transistor, between the control portion 202 and the photoelectric conversion portion 201 and between the photoelectric conversion element 101 and the pixel signal processing portion 102 to switch electrical connections. Likewise, potential supply may be electrically switched between the high potential VH supplied to the control portion 202 and the low potential VL supplied to the photoelectric conversion portion 201 by using a switch, such as a transistor.

The pixel unit 106 including the plurality of the pixels 100 arranged in a matrix form may acquire a captured image through a rolling shutter operation in which the counts of the counter circuits 204 are sequentially reset in row units, and detected signals stored in the counter circuits 204 are sequentially output in row units.

Alternatively, the pixel unit 106 may acquire a captured image through a global electronic shutter operation in which the counts of the counter circuits 204 of all the pixel rows are reset at the same time, and detected signals stored in the counter circuits 204 are sequentially output in row units. When performing the global electronic shutter operation, it is desirable to provide a unit for switching between a case where the counter circuit 204 performs counting and a case where the counter circuit 204 does not perform counting. The unit for switching is, for example, the switch described above.

The present exemplary embodiment has been described above centering on a configuration for acquiring a captured image by using the counter circuit 204. However, the light detection apparatus 1010 may acquire a pulse detection timing by using a Time to Digital Converter (TDC) and a memory, instead of the counter circuit 204.

At this time, the generation timing of the pulse signal output from the waveform shaping portion 203 is converted into a digital signal by the TDC. For measurement of the pulse signal timing, the TDC is supplied with a control pulse pREF (reference signal) from the vertical scanning circuit unit 103 (FIG. 1) via the drive line 208. Based on the control pulse pREF, the TDC acquires, as a digital signal, a signal when a signal output from each pixel via the waveform shaping portion 203 is input at a relative timing.

For example, the Delay Line method in which buffer circuits are connected in series to produce a delay or the Looped TDC method in which delay lines are connected in a loop is used for the circuit of the TDC. Although another circuit method may be used, the method would need to achieve a time resolution equivalent to or higher than the time resolution of the photoelectric conversion portion 201.

The digital signal indicating the pulse detection timing obtained by the TDC is stored in one memory or a plurality of memories. If a plurality of memories is provided, a plurality of signals is supplied to the selection circuit 206. This enables controlling the output to the signal line 107 for each memory when outputting the digital signal stored in the memories to the signal line 107.

Figure 3A:
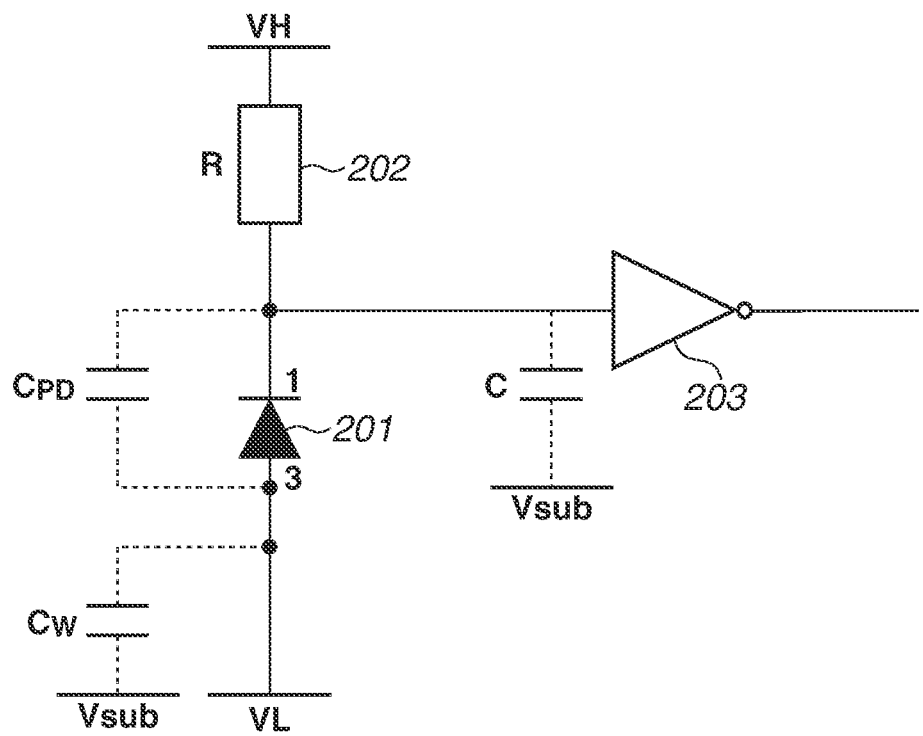
FIGS. 3A and 3B illustrate examples of connections of a control portion.

The control portion 202 according to the present exemplary embodiment will be described below with reference to FIGS. 3A and 3B. According to the present exemplary embodiment, the control portion 202 has two different configurations. In the first configuration, the control portion 202 is disposed on the side of the cathode of the photoelectric conversion portion 201 which is supplied with the high potential VH, as illustrated in FIG. 3A. In the second configuration, the control portion 202 is disposed on the side of the anode of the photoelectric conversion portion 201 which is supplied with the low potential VL, as illustrated in FIG. 3B.

Figure 3B:
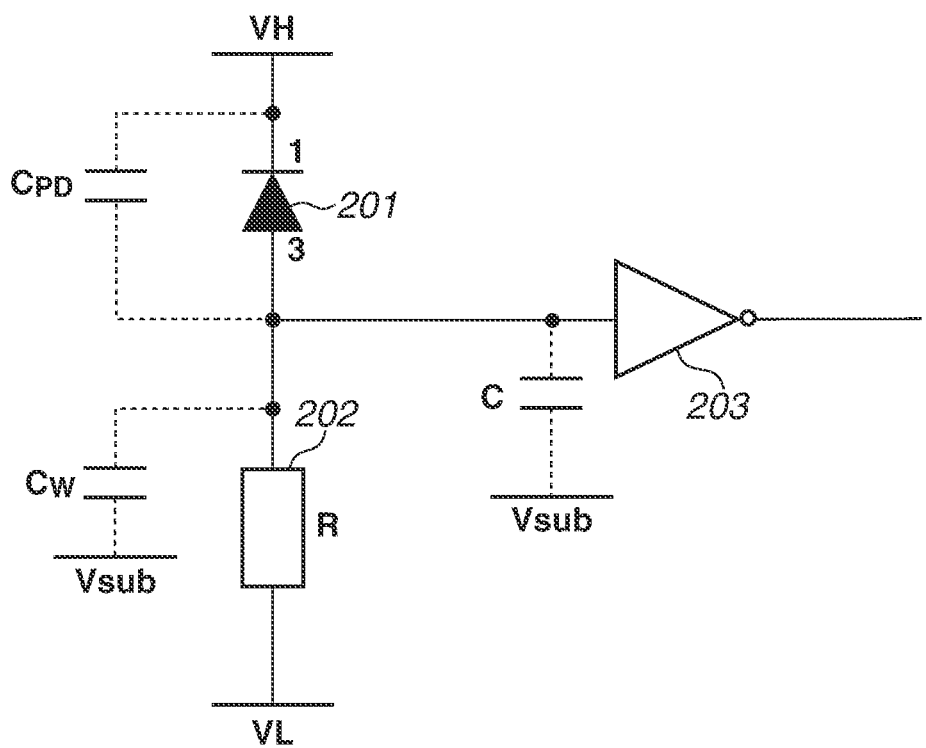

Referring to the configurations illustrated in FIGS. 3A and 3B, a predetermined time period is provided from the time when the input potential of the waveform shaping portion 203 changes with the avalanche current till the time when the input potential is restored to the bias in the initial state of the photoelectric conversion portion 201 by the voltage drop by the control portion 202. The time period since electric charges are once detected until the bias state where electric charges are detectable next time is restored is referred to as a dead time. The shorter the Dead time, the larger the number of electric charges countable per unit time, and the wider the dynamic range of the light detection apparatus 1010.

As an example, if the control portion 202 is a resistive element, the dead time ($\tau d$ [s]) of the avalanche diode according to the present exemplary embodiment is determined by the product of the resistance (R [$\Omega$]) and the input terminal capacitance (C [F]). In the following equations, Cpd denotes the PN junction capacitance of the photoelectric conversion portion 201, Cw denotes the capacitance of a well of the photoelectric conversion portion 201, and C denotes the parasitic capacitance of wiring and diffusion layers.

Referring to FIG. 3A, the dead time is calculated by Equation 1.

$$\tau d = R(Cpd + C) \quad \text{(Equation 1)}$$

Referring to FIG. 3B, the Dead time is calculated by Equation 2.

$$\tau d = R(Cpd + Cw + C) \quad \text{(Equation 2)}$$

The PN junction capacitance Cpd of the photoelectric conversion portion 201 is the PN junction capacitance of a light detection region where a strong electric field is induced to cause the avalanche multiplication.

The above description of the control portion 202 as a resistive element also applies to an active quench circuit.

As described above, for a pixel according to the present exemplary embodiment, the effect of improving the dynamic range in a case where the control portion 202 is disposed on the cathode side of the photoelectric conversion portion 201 is larger than the effect in a case where the control portion 202 is disposed on the anode side thereof.

Planar structures and cross-sectional structures of the light detection apparatus 1010 according to the present exemplary embodiment will be described below.

FIG. 4 is a cross-sectional view schematically illustrating the photoelectric conversion portion 201 (avalanche diode) according to the present exemplary embodiment. The avalanche diode according to the present exemplary embodiment is disposed on a semiconductor substrate 15 having a first surface, and a second surface opposite to the first surface. For example, the first surface is the front surface of the semiconductor substrate 15, and the second surface is the rear surface of the semiconductor substrate 15. According to the present exemplary embodiment, the direction from the first to second surface is referred to as a depth direction. The reference surface of the depth in the semiconductor substrate 15 is the first surface. A gate electrode of a transistor and a multilayer wiring structure are disposed on the first surface side of the semiconductor substrate 15.

Referring to FIG. 4, a first semiconductor region (N-type semiconductor region) 1 of a first conductivity type and a second semiconductor region (P-type semiconductor region) 2 of a second conductivity type are disposed in a region sandwiched between the separation portions 16. A third semiconductor region (P-type semiconductor region) 3 of the second conductivity type, a fourth semiconductor region (P-type semiconductor region) 4 of the second conductivity type, and a fifth semiconductor region (P-type semiconductor region) 5 of the second conductivity type are also disposed in the region sandwiched between the separation portions 16. The separation portion 16 includes a first separation portion and a second separation portion which are formed to sandwich the avalanche diode.

In the semiconductor substrate 15 with the plurality of the pixels 100 disposed thereon, the separation portion 16 is disposed to electrically separate the plurality of the pixels 100.

In a first depth X, the N-type semiconductor region 1 and a P-type semiconductor region 9 are disposed. The N-type semiconductor region 1 and the P-type semiconductor region 9 are in contact with each other. The P-type semiconductor region 9 is disposed between the N-type semiconductor region 1 and the separation portion 16. Disposing the N-type semiconductor region 1 and the P-type semiconductor region 9 in the first depth X means, for example, disposing a region having the highest (peak) ion-implanted impurity density in the first depth X. However, the peak does not need to be disposed in the first depth X, and a design error and a manufacture error are also permitted.

The P-type semiconductor region 2 and the P-type semiconductor region 9 are disposed in a second depth Y which is deeper than the first depth X with respect to the first surface. The P-type semiconductor regions 2 and 9 are in contact with each other.

The P-type semiconductor region 2 overlaps with at least a part of the N-type semiconductor region 1. The P-type semiconductor region 9 is disposed between the P-type semiconductor region 2 and the separation portion 16.

The P-type semiconductor region 3 and the P-type semiconductor region 9 are disposed in a third depth Z which is deeper than the second depth Y with respect to the first surface. The P-type semiconductor regions 3 and 9 are in contact with each other.

The P-type semiconductor region 3 overlaps with at least a part of the P-type semiconductor region 2 in a plan view. The P-type semiconductor region 9 is disposed between the P-type semiconductor region 3 and the separation portion 16.

The P-type semiconductor region 4 is disposed in a fourth depth W which is deeper than the third depth Z with respect to the first surface. Each of the P-type semiconductor regions 3 and 9 overlaps with the P-type semiconductor region 4 in a plan view.

The P-type semiconductor region 5 is disposed in a fifth depth which is deeper than the fourth depth W with respect to the first surface. The P-type semiconductor region 4 overlaps with the P-type semiconductor region 5.

The separation portion 16 is formed of a P-type semiconductor region disposed from the first surface toward the depth direction. More specifically, as the separation portion 16, P-type semiconductor regions 7 and 8 are disposed from the first surface toward the depth direction in this order in contact with each other. The P-type semiconductor region 7 is electrically connected with the P-type semiconductor regions 8, 5, and 4.

The impurity density of the P-type semiconductor region 7 is higher than the impurity densities of the P-type semiconductor regions 8, 5, 4, and 3. For example, connecting the P-type semiconductor region 7 and a contact plug 17 provides a lower contact resistance than connecting the P-type semiconductor region 8 and the contact plug 17.

The N-type semiconductor region 1 is supplied with a potential which serves as a reverse bias with respect to the separation portion 16.

The impurity density of the P-type semiconductor region 3 is equal to or lower than that of the P-type semiconductor region 8. The P-type semiconductor region 3 and the N-type semiconductor region 1 form a PN junction. With this PN junction, the entire P-type semiconductor region 2 becomes a depletion layer region. This depletion layer region extends up to a part of the N-type semiconductor region 1 and a part of the P-type semiconductor region 3. A strong electric field is induced in the extended depletion layer region. More specifically, the avalanche multiplication is caused by the strong electric field generated between the P-type semiconductor region 3 and the N-type semiconductor region 1. This strong electric field causes the avalanche multiplication in the depletion layer region which extends from a part of the P-type semiconductor region 3 to a part of the N-type semiconductor region 1. Accordingly, a current based on the multiplied electric charge is output from the wiring line 10. More specifically, according to the present exemplary embodiment, the light detection region becomes a depletion layer region in a part of the N-type semiconductor region 1.

The impurity densities of the N-type semiconductor region 1, the P-type semiconductor region 2, and the P-type semiconductor region 3 will be described below. When the impurity densities of these semiconductor regions are set to an impurity density with which, when the potential difference for causing the avalanche multiplication in the depletion layer region formed at a part of the N-type semiconductor region 1 is supplied, the depletion layer region does not reach the portion where the depletion layer region contacts the first surface of the N-type semiconductor region 1. This is because, if the depletion layer region extends to come into contact with the first surface of the semiconductor substrate 15, the probability that noise resulting from the dangling bond of the front surface of the semiconductor substrate 15 enters the depletion layer region from the first surface increases.

The potential difference between the N-type semiconductor region 1 and the separation portion 16 is set such that a sufficiently strong electric field in the depth direction is induced in the extended depletion layer. The potential difference for inducing a sufficiently strong electric field refers to a potential difference with which electric charges affected by the electric field cause the avalanche multiplication, i.e., the potential difference between the N-type semiconductor region 1 and the P-type semiconductor region 3 with which the photoelectric conversion portion 201 operates as an avalanche diode (APD or SPAD).

More specifically, the potential difference between the N-type semiconductor region 1 and the P-type semiconductor region 3 is 6V or more. In this case, the entire P-type semiconductor region 2 electrically connected with the N-type semiconductor region 1 becomes a depletion layer region as described above, and a strong electric field causing the avalanche multiplication is generated in the depletion layer region extending to a part of the N-type semiconductor region 1 and a part of the P-type semiconductor region 3.

More desirably, the potential difference between the N-type semiconductor region 1 and the P-type semiconductor region 3 is 10V or more and 30V or less. In this case, the N-type semiconductor region 1 is supplied with a potential of 10V or more, and the P-type semiconductor region 3 is supplied with a potential of 0V or less. However, the present disclosure is not limited to the values of these potentials as long as the potential difference becomes 6V or more.

The impurity density of the P-type semiconductor region 4 is equal to or less than that of the P-type semiconductor region 3. For example, the impurity density of the P-type semiconductor region 4 is equal to or less than $1.0*10^{17}$ [atoms/cm$^3$]. (In the present specification, $\hat{\ }$ denotes a power, i.e., $10^{17}$ denotes the 17th power of 10.) This means that the impurity density of the P-type semiconductor region 3 may be identical to the impurity density of the P-type semiconductor region 4.

As an example, FIG. 4 illustrates a region having the same impurity density as the P-type semiconductor region 4. However, the P-type semiconductor region 4 preferably has an impurity density gradient with which electric charges move to the first surface side of the semiconductor substrate 15. Providing such an impurity density gradient makes it easier for electric charges to move to the N-type semiconductor region 1.

For example, the P-type semiconductor region 4 has a first region, a second region disposed at a position deeper than the first region with respect to the first surface, and a third region disposed at a position deeper than the second region with respect to the first surface. When the first, second, and third regions have the first, second, and third impurity densities, respectively, a condition "First impurity density<Second impurity density<Third impurity density" may be satisfied. The first impurity density is lower than that of the P-type semiconductor region 3.

The P-type semiconductor region 5 is disposed at a position deeper than the P-type semiconductor region 4 to define the depth of a photoelectric conversion region. The impurity density of the P-type semiconductor region 5 is made higher than that of the P-type semiconductor region 3. Accordingly, electric charges generated in the vicinity of the P-type semiconductor region 5 easily move toward the first surface.

A contact plug 18 is connected to the N-type semiconductor region 1, and a wiring line 10 is connected to the contact plug 18. The contact plug 17 is connected to the P-type semiconductor region 7, and a wiring line 11 is connected to the contact plug 17. The wiring line 10 or 11 is connected to the control portion 202, such as a resistive element for performing the quench operation. The following description will be made on the premise that the control portion 202 is connected to the wiring line 10.

In the description with reference to FIG. 4, the contact plug 17 and the wiring line 11 are disposed on the first surface side. However, the contact plug 17 and the wiring line 11 may be disposed on the second surface side.

When the contact plug 17 and the wiring line 11 are disposed on the second surface side, the impurity density of the region where the contact plug 17 is disposed out of the P-type semiconductor regions 5 preferably is higher than that of the P-type semiconductor region 7. More specifically, the P-type semiconductor region 7 results. In this case, since the contact plug 17 is not connected to the P-type semiconductor region 7 disposed on the first surface side, the impurity density preferably is approximately the same as that of the P-type semiconductor region 8. This structure enables reducing the electric field generated between the P-type semiconductor region 7 and the N-type semiconductor region 1.

Also, when the separation portion 16 has an insulated separation portion on the first surface side, the contact plug 17 and the wiring line 11 are disposed on the second surface side. In this case, the separation portion 16 is formed by disposing the insulated separation portion, the P-type semiconductor region 8, and the P-type semiconductor region 7 in this order in contact with each other in an overlapped way in the depth direction from the first surface.

Planar structures of the separation portion 16 and the photoelectric conversion region sandwiched between the separation portions 16 in an arbitrary depth in the cross-sectional structure illustrated in FIG. 4 will be described below with reference to the schematic plan views illustrated in FIGS. 5A, 5B, and 5C. Although, in FIGS. 5A, 5B, and 5C, the boundaries of the semiconductor regions are drawn as circles, the present disclosure is not limited thereto.

Figure 5A:
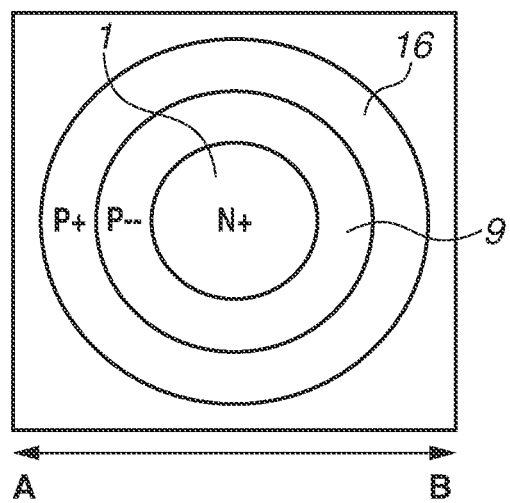
FIGS. 5A, 5B, and 5C are top views illustrating the avalanche diode.

FIG. 5A is a schematic plan view taken along the line A-B in the first depth X illustrated in FIG. 4. FIG. 5B is a schematic plan view taken along the line C-D in the second depth Y illustrated in FIG. 4. FIG. 5C is a schematic plan view taken along the line E-F in the third depth Z illustrated in FIG. 4.

As illustrated in FIG. 5A, in the first depth X, the N-type semiconductor region 1 is enclosed in the P-type semiconductor region 9 in a plan view, and the P-type semiconductor region 9 is enclosed in the separation portion 16 in a plan view.

Figure 5B:
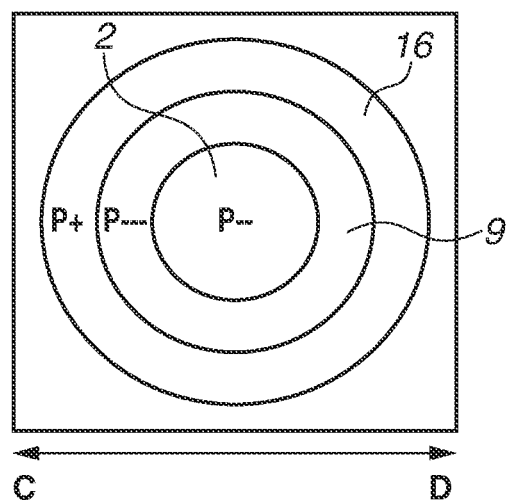

As illustrated in FIG. 5B, in the second depth Y, the P-type semiconductor region 2 is enclosed in the P-type semiconductor region 9 in a plan view, and the P-type semiconductor region 9 is enclosed in the separation portion 16 in a plan view.

Figure 5C:
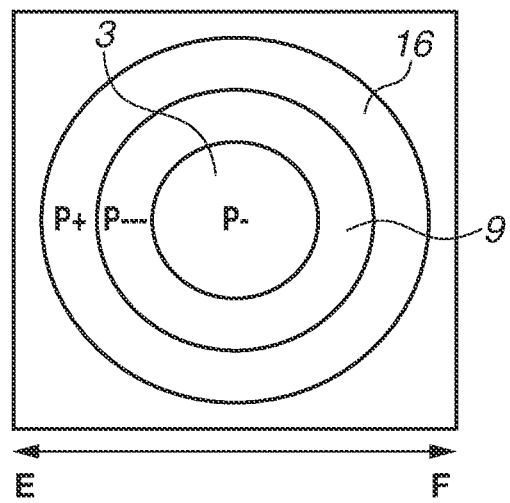

As illustrated in FIG. 5C, in the third depth Z, the P-type semiconductor region 3 is enclosed in the P-type semiconductor region 9 in a plan view, and the P-type semiconductor region 9 is enclosed in the separation portion 16 in a plan view. As clearly illustrated in FIGS. 4, 5A, 5B, and 5C, in a plan view, the P-type semiconductor region 2 overlaps with at least a part of the N-type semiconductor region 1, the P-type semiconductor region 3 overlaps with at least a part of the P-type semiconductor region 2, and the P-type semiconductor region 3 and the P-type semiconductor region 9 overlap with the P-type semiconductor region 4.

Referring to FIGS. 5A to 5C as examples, if the N-type semiconductor region 1, the P-type semiconductor region 2, and the P-type semiconductor region 3 have overlapping portions in a plan view, the avalanche multiplication can be caused.

Figure 6:
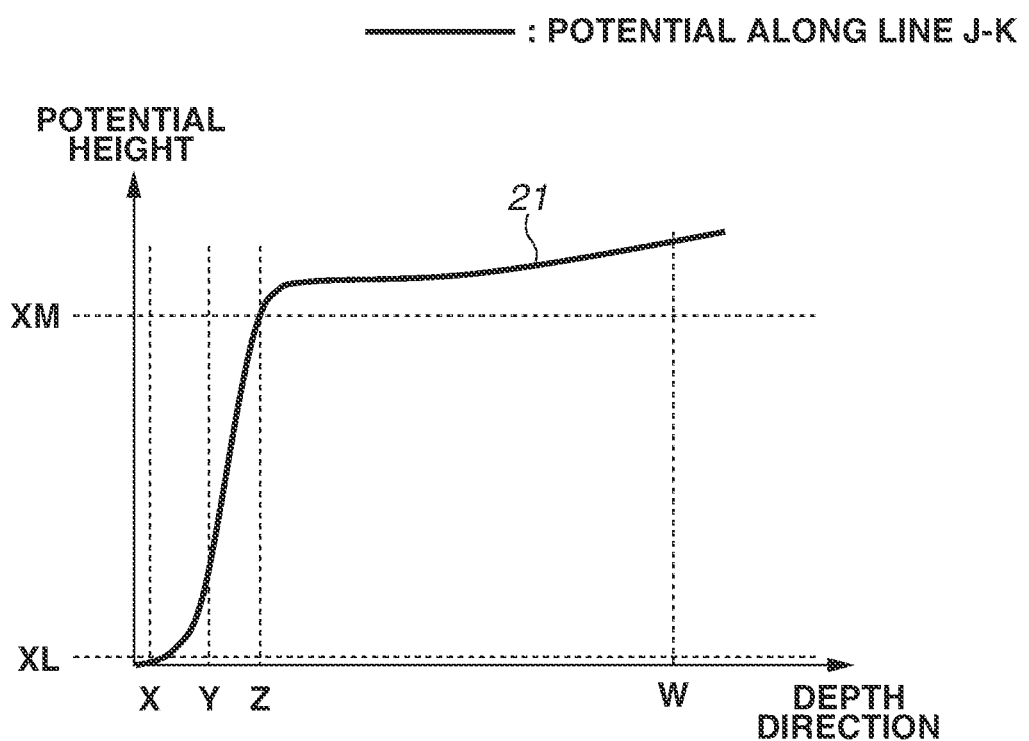
FIG. 6 illustrates a potential height of the avalanche diode.

FIG. 6 illustrates a potential according to the present exemplary embodiment. FIG. 6 illustrates an example of a potential distribution taken along the line J-K in the cross-sectional view illustrated in FIG. 4. A solid line 21 indicates the potential height of the line J-K. More specifically, the solid line 21 indicates the potential viewed from electrons as main carrier electric charges in the N-type semiconductor region. When holes are main carrier electric charges, the relation of the potential height is reversed.

Referring to FIG. 6, the depths X, Z, and W correspond to each depth illustrated in FIG. 4.

The potential height of a level XM indicates the potential height of the P-type semiconductor region 3. The potential height at a level XL indicates the potential height of the N-type semiconductor region 1.

Referring to the solid line 21, the potential height gradually decreases as the depth changes from the depth W to the depth Z. In the depth close to the depth Z, the potential height begins to steeply decreases. In the depth Z, the potential height becomes the level H. The potential height steeply decreases as the depth changes from the depth Z to the depth X. In the depth X, the potential height becomes the level XL.

In the depth W, the potential of the solid line 21 has an almost constant height. In the region taken along the line J-K, the potential gradient moderately decreases toward the first surface side of the semiconductor substrate 15. Therefore, electric charges generated in the photoelectric conversion element move to the first surface side according to the moderate potential gradient.

Electric charges are accelerated by the steep potential gradient, i.e., a strong electric field in the region from the depth Z to the depth X, and the accelerated electric charges reach the N-type semiconductor region 1. In the region from the depth Z to the depth X, the avalanche multiplication is caused.

As illustrated in FIG. 6, the difference in potential height between the N-type semiconductor region 1 and the P-type semiconductor region 2 is smaller than the difference in potential height between the N-type semiconductor region 1 and the P-type semiconductor region 3. In other words, the P-type semiconductor region 2 having a lower potential than the P-type semiconductor region 3 is formed in the region between the N-type semiconductor region 1 and the P-type semiconductor region 3. The potential of each semiconductor region in this case can be the potential in the depth at the peak position of the impurity density.

By forming the P-type semiconductor region 2, the light detection apparatus 1010 according to the present exemplary embodiment enables reducing the strong electric field generated between the N-type semiconductor region 1 and the P-type semiconductor region 3 in comparison with a case where the P-type semiconductor region 2 is not formed.

This structure enables reducing the strong electric field generated between the N-type semiconductor region 1 and the P-type semiconductor region 3 while preventing the fall of the impurity density of the P-type semiconductor region 3 which forms a PN junction with the N-type semiconductor region 1. More specifically, this structure enables reducing electrons which produce the tunneling effect in the PN junction, thus achieving noise reduction. Accordingly, noise can be reduced while preventing the rise of the operating voltage required for the avalanche multiplication.

Figure 7:
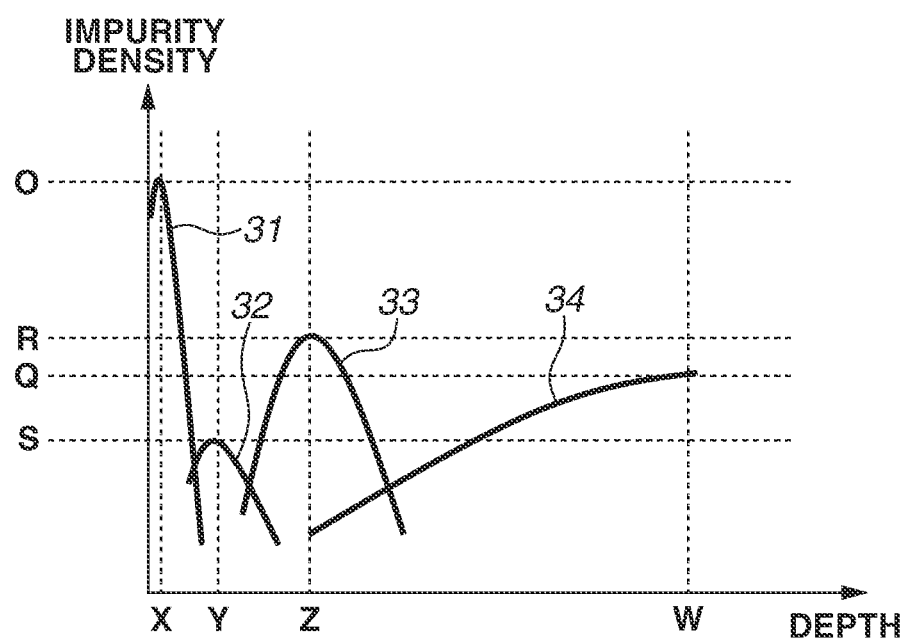
FIG. 7 illustrates impurity densities of the avalanche diode.

FIG. 7 illustrates impurity density distributions according to the present exemplary embodiment. More specifically, FIG. 7 illustrates examples of impurity density distributions taken along the line J-K in the cross-sectional view illustrated in FIG. 4. A line 31 indicates the N-type impurity density distribution in the N-type semiconductor region 1 taken along the line J-K. A line 32 indicates the P-type impurity density distribution in the P-type semiconductor region 2 taken along the line J-K. A line 33 indicates the P-type impurity density distribution in the P-type semiconductor region 3 taken along the line J-K. A line 34 indicates the P-type impurity density distribution in the P-type semiconductor region 4 taken along the line J-K.

Referring to FIG. 7, the depths X, Y, Z, and W correspond to each depth illustrated in FIG. 4.

The impurity density at a level O indicates the peak value of the impurity density of the N-type semiconductor region 1. The impurity density at a level S indicates the peak value of the impurity density of the P-type semiconductor region 2. The impurity density at a level R indicates the peak value of the impurity density of the P-type semiconductor region 3. The impurity density at a level Q indicates the peak value of the impurity density of the P-type semiconductor region 4.

The peak value S of the impurity density of the P-type semiconductor region 2 is smaller than the peak value R of the impurity density of the P-type semiconductor region 3. The peak value Q of the impurity density of the P-type semiconductor region 4 is smaller than the peak value R of the impurity density of the P-type semiconductor region 3. For example, when the impurity density of the N-type semiconductor region 1 is $1*10^17$ [atoms/(cm^3)] or more, the impurity density of the P-type semiconductor region 2 is $1*10^6$ [atoms/(cm^3)] or less, and the impurity density of the P-type semiconductor region 3 is $1*10^6$ [atoms/(cm^3)] or more and $1*10^17$ [atoms/(cm^3)] or less.

As described above, by forming the P-type semiconductor region 2, the light detection apparatus 1010 according to the present exemplary embodiment can reduce the strong electric field generated between the N-type semiconductor region 1 and the P-type semiconductor region 3 in comparison with a case where the P-type semiconductor region 2 is not formed.

This structure enables reducing the strong electric field generated between the N-type semiconductor region 1 and the P-type semiconductor region 3 while preventing the fall of the impurity density of the P-type semiconductor region 3 which forms a PN junction with the N-type semiconductor region 1. More specifically, this configuration enables reducing electrons which produce the tunneling effect in the PN junction, thus achieving noise reduction. Accordingly, noise can be reduced while preventing the rise of the operating voltage for the avalanche multiplication.

A light detection apparatus according to a second exemplary embodiment will be described below centering on differences from the light detection apparatus 1010 according to the first exemplary embodiment.

Figure 8:
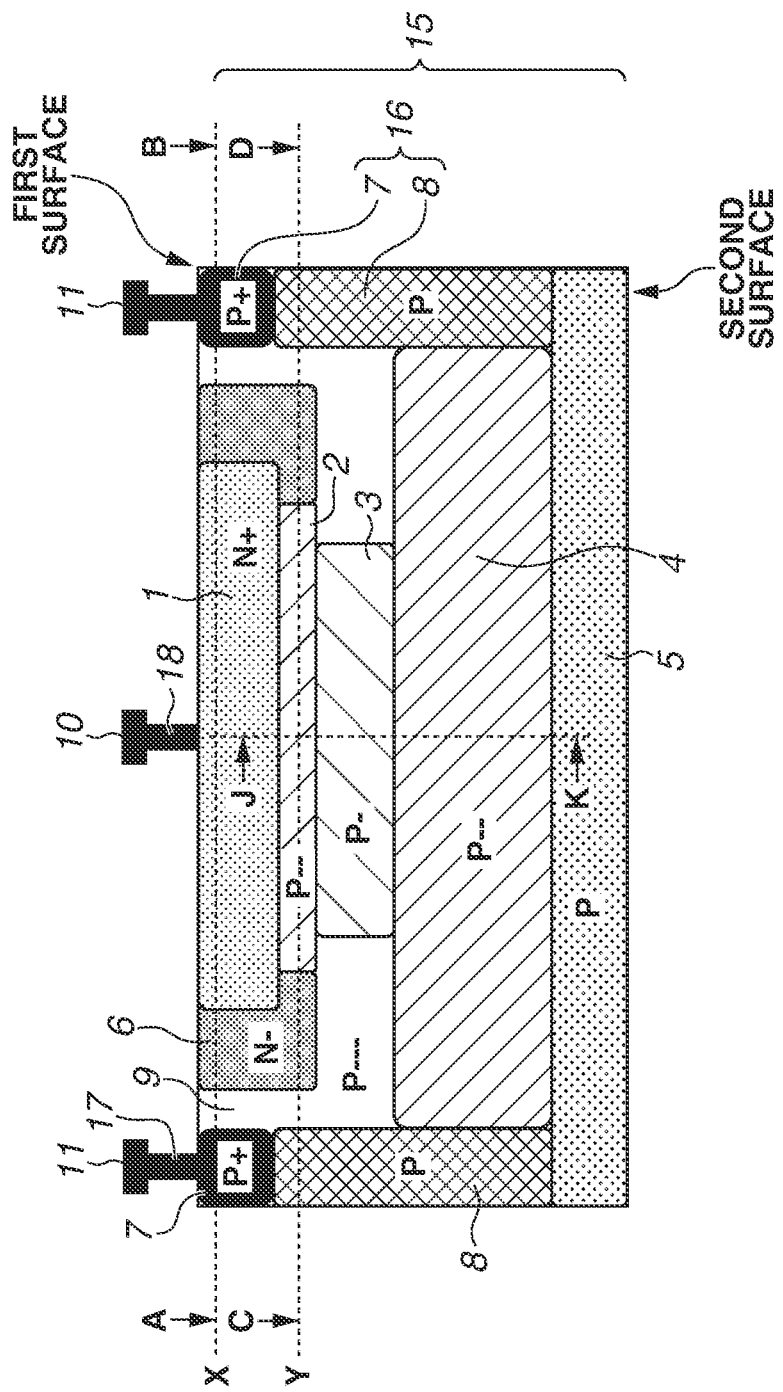
FIG. 8 is a cross-sectional view illustrating an avalanche diode.

FIG. 8 is a cross-sectional view schematically illustrating the avalanche diode according to the present exemplary embodiment. FIGS. 1, 2, 3A, 3B, 6, and 7 are similar to those according to the first exemplary embodiment. Elements having a similar function to those illustrated in FIGS. 1 to 7 are assigned the same reference numerals, and detailed descriptions thereof will be omitted. The avalanche diode illustrated in FIG. 8 differs from the avalanche diode illustrated in FIG. 4 in that a sixth semiconductor region (N-type semiconductor region) 6 of the first conductivity type is disposed in the region where the P-type semiconductor region 9 is disposed illustrated in FIG. 4. The N-type semiconductor region 6 is disposed from the side portion to the bottom of the N-type semiconductor region 1.

Referring to FIG. 8, the N-type semiconductor region 6 is disposed in a region sandwiched between the separation portions 16.

In the first depth X, the N-type semiconductor region 1, the N-type semiconductor region 6, and the P-type semiconductor region 9 are disposed. The N-type semiconductor regions 1 and 6 are in contact with each other. The N-type semiconductor region 6 and the P-type semiconductor region 9 are in contact with each other. The N-type semiconductor region 6 is disposed between the N-type semiconductor region 1 and the P-type semiconductor region 9.

In the second depth Y, the P-type semiconductor region 2, the N-type semiconductor region 6, and the P-type semiconductor region 9 are disposed. The P-type semiconductor region 2 and the N-type semiconductor region 6 are in contact with each other. The N-type semiconductor region 6 and the P-type semiconductor region 9 are in contact with each other. The N-type semiconductor region 6 is disposed between the P-type semiconductor regions 2 and 9.

The N-type semiconductor region 1 has a higher impurity density than the N-type semiconductor region 6. Providing impurity densities in this way enables intensifying the electric field in the depletion layer formed in the N-type semiconductor region 1.

The impurity density of the N-type semiconductor region 6 is made lower than that of the N-type semiconductor region 1. For example, when the impurity density of the N-type semiconductor region 1 is $1.0*10^{17}$ [atoms/(cm^3)] or more, the impurity density of the N-type semiconductor region 6 is $1.0*10^{6}$ [atoms/(cm^3)] or more and $1.0*10^{17}$ [atoms/(cm^3)] or less.

In this way, by forming the N-type semiconductor region 6 having a lower impurity density than the N-type semiconductor region 1 in the region between the N-type semiconductor region 1 and the P-type semiconductor region 9, the strong electric field generated between the N-type semiconductor region 1 and the P-type semiconductor region 9 is reduced in comparison with a case where the N-type semiconductor region 6 is not formed.

Although, in the configuration illustrated in FIG. 8, the N-type semiconductor region 6 without an impurity density gradient is disposed, the N-type semiconductor region 6 preferably is a region having an impurity density gradient. By providing an impurity density gradient in the region between the N-type semiconductor region 1 and the P-type semiconductor region 9, the strong electric field generated between the N-type semiconductor region 1 and the P-type semiconductor region 9 is reduced in comparison with a case where the N-type semiconductor region 6 does not have an impurity density gradient.

In this way, by providing an impurity density gradient in the region between the N-type semiconductor region 1 and the P-type semiconductor region 9, the strong electric field generated between the N-type semiconductor region 1 and the P-type semiconductor region 3 is reduced in comparison with a case where the N-type semiconductor region 6 does not have an impurity density gradient.

Planar structures of the separation portion 16 and the photoelectric conversion region sandwiched between the separation portions 16 in an arbitrary depth in the cross-sectional structure illustrated in FIG. 8 will be described below with reference to the schematic plan views illustrated in FIGS. 9A and 9B.

Figure 9A:
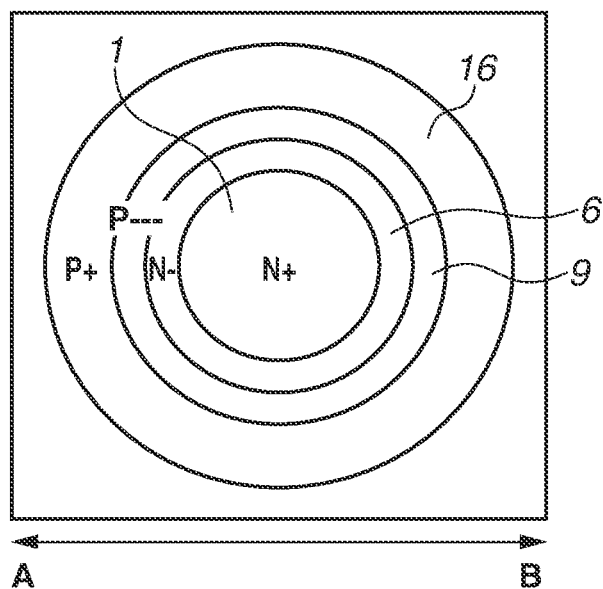
FIGS. 9A and 9B are top views illustrating the avalanche diode.

FIG. 9A is a schematic plan view taken along the line A-B in the first depth X illustrated in FIG. 8. FIG. 9B is a schematic plan view taken along the line C-D in the second depth Y illustrated in FIG. 8.

As illustrated in FIG. 9A, in the first depth X, the N-type semiconductor region 1 is enclosed in the N-type semiconductor region 6, the N-type semiconductor region 6 is enclosed in the P-type semiconductor region 9, and the P-type semiconductor region 9 is enclosed in the separation portion 16.

Figure 9B:
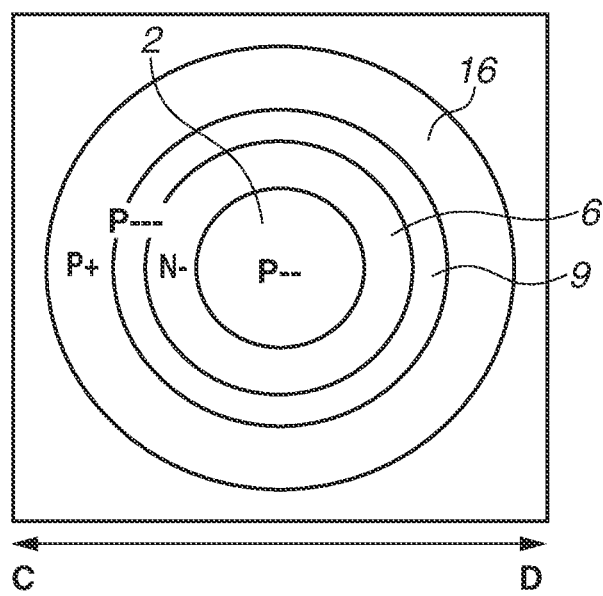

As illustrated in FIG. 9B, in the second depth Y, the P-type semiconductor region 2 is enclosed in the N-type semiconductor region 6, the N-type semiconductor region 6 is enclosed in the P-type semiconductor region 9, and the P-type semiconductor region 9 is enclosed in the separation portion 16.

As clearly illustrated in FIGS. 8, 9A, and 9B, in a plan view, the N-type semiconductor region 1 overlaps with at least a part of the N-type semiconductor region 6.

The light detection apparatus 1010 according to the present exemplary embodiment has the effect acquired by the light detection apparatus 1010 according to the first exemplary embodiment. The light detection apparatus 1010 according to the present exemplary embodiment is characterized in that, as described above, the N-type semiconductor region 6 having a lower impurity density than the N-type semiconductor region 1 is formed in the region between the N-type semiconductor region 1 and the P-type semiconductor region 9. This structure reduces the strong electric field generated between the N-type semiconductor region 1 and the P-type semiconductor region 9 in comparison with a case where the N-type semiconductor region 6 is not formed. Therefore, noise generated between the N-type semiconductor region 1 and the P-type semiconductor region 9 can be reduced.

A light detection apparatus according to a third exemplary embodiment will be described below centering on differences from the light detection apparatus 1010 according to the first exemplary embodiment.

Figure 10:
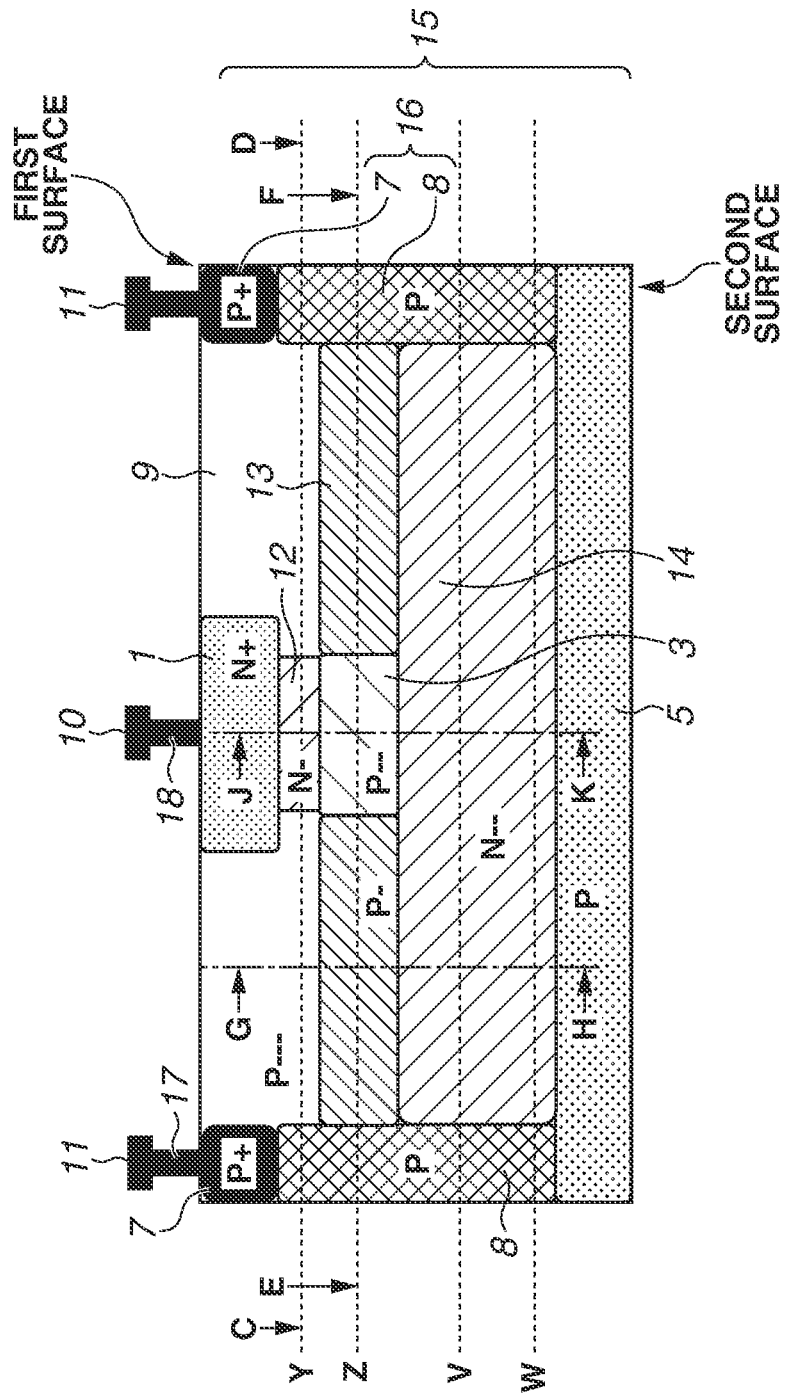
FIG. 10 is a cross-sectional view illustrating an avalanche diode.

FIG. 10 is a cross-sectional view schematically illustrating the avalanche diode according to the present exemplary embodiment. FIGS. 1, 2, 3A, and 3B are similar to those according to the first exemplary embodiment. Referring to FIG. 10, elements having a similar function to those illustrated in FIGS. 1 to 9B are assigned the same reference numerals, and detailed descriptions thereof will be omitted.

Referring to FIG. 10, a twelfth semiconductor region (N-type semiconductor region) 12 of the first conductivity type, a thirteenth semiconductor region (P-type semiconductor region) 13 of the second conductivity type, and a fourteenth semiconductor region (N-type semiconductor region) 14 of the first conductivity type are disposed in a region sandwiched between the separation portions 16.

In the second depth Y, the N-type semiconductor region 12 and the P-type semiconductor region 9 are disposed. The N-type semiconductor region 12 and the P-type semiconductor region 9 are in contact with each other. The N-type semiconductor region 12 overlaps with at least a part of the N-type semiconductor region 1, and the P-type semiconductor region 9 is disposed between the N-type semiconductor region 12 and the separation portion 16.

The P-type semiconductor region 3 and the P-type semiconductor region 13 are disposed in the third depth Z. The P-type semiconductor regions 3 and 13 are in contact with each other. The P-type semiconductor region 13 is disposed between the P-type semiconductor region 3 and the separation portion 16. The N-type semiconductor region 12 and the P-type semiconductor region 3 overlap with each other.

The N-type semiconductor region 14 is disposed in the fourth depth W. The P-type semiconductor region 3 and the P-type semiconductor region 13 overlap with the N-type semiconductor region 14.

The impurity density of the N-type semiconductor region 12 is lower than that of the N-type semiconductor region 1. For example, the impurity density of the N-type semiconductor region 1 is $1*10^{\sim}$[atoms/(cm$^3$)] or more and $5*10^{19}$ [atoms/(cm$^3$)] or less. The impurity density of the N-type semiconductor region 12 is $1*10^{17}$ [atoms/(cm$^3$)] or more and $5*10^{17}$ [atoms/(cm$^3$)] or less.

The N-type semiconductor region 12 having a lower impurity density than the N-type semiconductor region 1 is formed in the region between the N-type semiconductor region 1 and the P-type semiconductor region 3. This structure reduces the strong electric field generated between the N-type semiconductor region 1 and the P-type semiconductor region 3 in comparison with a case where the N-type semiconductor region 12 is not formed.

By reducing the strong electric field generated between the N-type semiconductor region 1 and the P-type semiconductor region 3 without lowering the impurity density of the P-type semiconductor region 3 for forming a PN junction region, the rise of the operating voltage can be prevented.

In FIG. 10, it is assumed that the N-type semiconductor region 14 having a lower density than the N-type semiconductor region 1 is formed immediately under the high-density N-type semiconductor region 1 without forming the N-type semiconductor region 12 and the P-type semiconductor regions 3 and 13. In this case, although electric charges can be generated in the N-type semiconductor region 14 and read from the N-type semiconductor region 1, it is difficult to cause the avalanche multiplication under a voltage condition equivalent to that according to the present exemplary embodiment. This is because the most part of the potential difference applied between the N-type semiconductor region 1 and the P-type semiconductor region 7 is applied to the depletion layer region of the N-type semiconductor region 14, resulting in a decrease in the potential difference applied to the avalanche multiplication region in the vicinity of the N-type semiconductor region 1. On the other hand, according to the present exemplary embodiment, the N-type semiconductor region 14 is surrounded by the P-type semiconductor regions in all directions, and therefore the potential level of the N-type semiconductor region 14 becomes closer to that of the surrounding P-type semiconductor regions than to that of the N-type semiconductor region 1. More specifically, by restricting the excessive extension of the depletion layer into the substrate depths in the P-type semiconductor region 13, it becomes possible to concentrate the most part of the above-described potential difference to be applied, into the avalanche multiplication region in the vicinity of the N-type semiconductor region 1. Accordingly, the avalanche multiplication of photocarriers can be caused at a low voltage.

Referring to FIG. 10, as an example, the N-type semiconductor region 14 indicates a region having the same impurity density. However, the N-type semiconductor region 14 preferably has an impurity density gradient so as to provide a potential structure in which electric charges move to the first surface side of the semiconductor substrate 15. Providing such an impurity density potential makes it easier for electric charges to move to the N-type semiconductor region 1.

If the N-type semiconductor region 14 has an impurity density gradient so as to provide a potential structure in which electric charges move to the first surface side of the semiconductor substrate 15, the first surface side of the region where the N-type semiconductor region 14 is disposed may be an N-type semiconductor region and the second surface side thereof may be a P-type semiconductor region.

Alternatively, a P-type semiconductor region having a lower impurity density than the P-type semiconductor region 13 may be disposed instead of the N-type semiconductor region 14. Even in such a case, the N-type semiconductor region 14 preferably has an impurity density gradient so as to provide a potential structure in which electric charges move to the first surface side of the semiconductor substrate 15.

Figure 12:
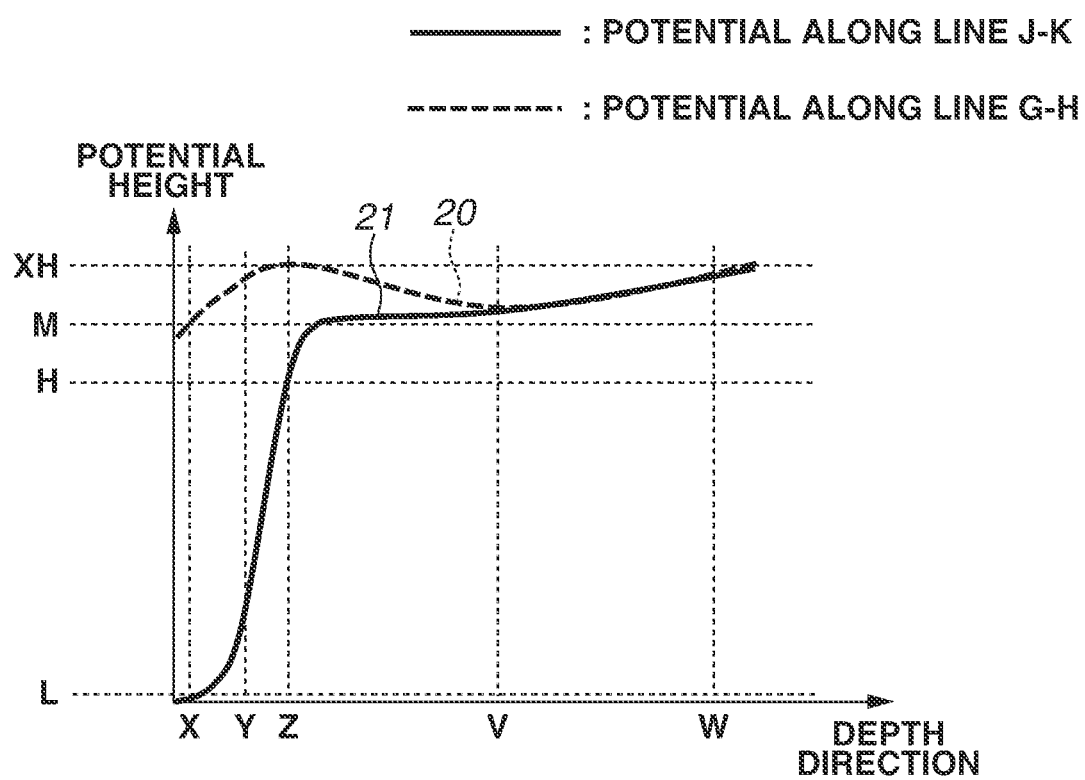
FIG. 12 illustrates a potential height of the avalanche diode.

Referring to FIG. 10, the impurity density of the P-type semiconductor region 13 is lower than that of the P-type semiconductor region 3 and that of the P-type semiconductor region 8. Therefore, also according to the present exemplary embodiment, a potential relation as illustrated in FIG. 12 (described below) is satisfied.

Planar structures of the separation portion 16 and the photoelectric conversion region sandwiched between the separation portions 16 in an arbitrary depth in the cross-sectional structure illustrated in FIG. 10 will be described below with reference to the schematic plan views illustrated in FIGS. 11A and 11B.

Figure 11A:
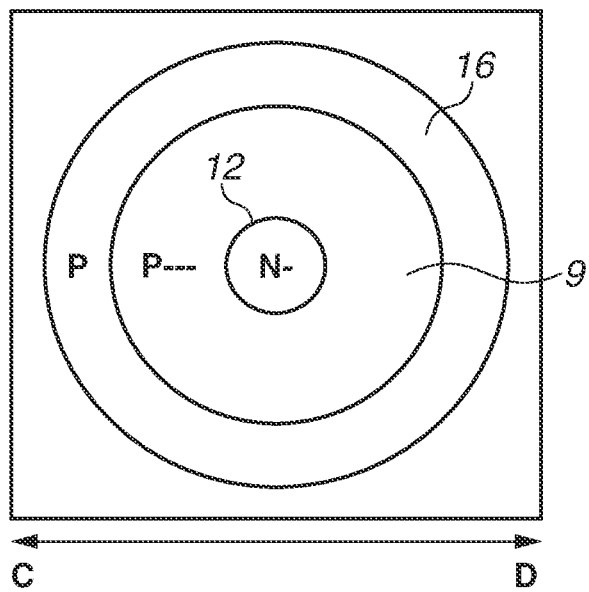
FIGS. 11A and 11B are top views illustrating the avalanche diode.

FIG. 11A is a schematic plan view taken along the line C-D in the second depth Y illustrated in FIG. 10. FIG. 11B is a schematic plan view taken along the line E-F in the third depth Z illustrated in FIG. 10.

As illustrated in FIG. 11A, in the second depth Y, the N-type semiconductor region 12 is enclosed in the P-type semiconductor region 9, and the P-type semiconductor region 9 is enclosed in the separation portion 16.

Figure 11B:
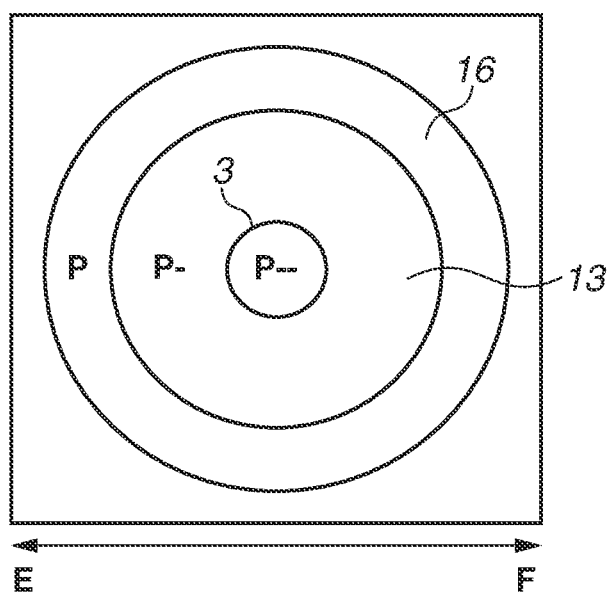

As illustrated in FIG. 11B, in third depth Z, the P-type semiconductor region 3 is enclosed in the P-type semiconductor region 13, and the P-type semiconductor region 13 is enclosed in the separation portion 16. As clearly illustrate in FIGS. 10, 11A, and 11B, in a plan view, the N-type semiconductor region 12 overlaps with at least a part of the N-type semiconductor region 1, the N-type semiconductor region 12 overlaps with the P-type semiconductor region 3, the P-type semiconductor region 3 and the P-type semiconductor region 13 overlap with the N-type semiconductor region 14, and the P-type semiconductor region 9 overlaps with the P-type semiconductor region 13.

The potential of the avalanche diode is illustrated in FIG. 12. FIG. 12 illustrates examples of potential distributions taken along the lines J-K and G-H in the cross-sectional view illustrated in FIG. 10. A dotted line 20 indicates the potential distribution taken along the line G-H. A solid line 21 indicates the potential distribution taken along the line J-K. More specifically, the lines 20 and 21 indicate the potentials viewed from electrons as main carrier electric charges in the N-type semiconductor region. When signal electric charges are holes, the relation of the potential height is reversed.

Referring to FIG. 12, the depths X, Y, Z, W, and V correspond to each depth illustrated in FIG. 10, and the depth V is an arbitrary depth between the depths Z and W.

The potential height at a level XH indicates the potential height of the P-type semiconductor region 13. The potential height at a level H indicates the potential height of the P-type semiconductor region 3. The potential height at a level M is the potential height of the P-type semiconductor region 9.

The potential height at a level L level indicates the potential height of the N-type semiconductor region 1.

The dotted line 20 indicates the potential height between the levels XH and H in the depth V. The potential height gradually decreases as the depth changes from the depth W to the depth V. The potential height gradually increases as the depth changes from the depth V to the depth Z and becomes the level XH in the depth Z. The potential height gradually decreases as the depth changes from the depth Z to the depth X and becomes the level M in the depth X.

The solid line 21 indicates the potential height between the levels XH and H in the depth W. The potential height gradually decreases as the depth changes from the depth W to the depth Z. In the depth close to the depth Z, the potential height begins to steeply decreases. In the depth Z, the potential height becomes the level H. The potential height steeply decreases as the depth changes from the depth Z to a depth close to the depth X and becomes the level L in the depth X.

In the depth W, each of the potentials of the solid lines 20 and 21 has an almost constant height. In the regions taken along the lines G-H and J-K, the potential gradient moderately decreases toward the first surface side of the semiconductor substrate 15. Therefore, electric charges generated in the photoelectric conversion element move to the first surface side by the moderate potential gradient.

As the depth changes from the depth V to the depth Z, the potential gradient of the solid line 21 moderately decreases, and electric charges move to the first surface side. On the other hand, with respect to the dotted line 20, a potential gradient is formed as a potential barrier against electric charges moving to the first surface. This potential barrier (the P-type semiconductor region 13) prevents electric charges from moving from the N-type semiconductor region 14 to the P-type semiconductor region 9. The potential in the direction of movement from the line G-H to the line J-K is low with respect to this potential barrier. Therefore, in the depth from V to Z, electric charges existing in the line G-H easily move to the vicinity of the line J-K in the process of movement to the first surface.

Electric charges that moved in the vicinity of the region taken along the line J-K are accelerated by the steep potential gradient, i.e., the strong electric field in the region from the depth Z to the depth X. The accelerated electric charges reach the N-type semiconductor region 1. In the region in the depth Z to the depth X, the avalanche multiplication is caused. On the other hand, the region taken along the line G-H has a potential distribution which does not cause the avalanche breakdown or is more unlikely to cause the avalanche breakdown than in the region taken along the line J-K particularly in the region from the depth Z to the depth X taken along the line J-K. As an example for achieving this potential structure, the difference in potential height between the N-type semiconductor region 1 and the P-type semiconductor region 13 preferably is larger than the difference in potential height between the P-type semiconductor regions 9 and 13.

The use of the above-described potential structure makes it possible to reduce noise electric charges generated by the above-described tunneling effect in comparison with the conventional configuration in which the avalanche breakdown occurs over the entire avalanche diode. In addition, the avalanche diode according to the present exemplary embodiment does not incur sensitivity degradation. This is because of a potential structure in which signal electric charges existing in the region of the N-type semiconductor regions 14 overlapping with the P-type semiconductor region 13 easily move to the first semiconductor region 1 through the P-type semiconductor region 3.

More specifically, the potential height of the P-type semiconductor region 3 is lower than that of the P-type semiconductor region 13. More specifically, the P-type semiconductor region 13 functions as a potential barrier against signal electric charges existing in the N-type semiconductor region 14, making it easier for electric charges to move to the N-type semiconductor region 1 through the P-type semiconductor region 3.

FIG. 12 illustrates the potential structure in a case where the third semiconductor region 3 is a P-type semiconductor region. Even in a case where the third semiconductor region 3 is an N-type semiconductor region, at the position Z, the potential height of the dotted line 20 is higher than that of the solid line 21. In addition, FIG. 12 illustrates the potential structure in a case where the ninth semiconductor region 9 is a P-type semiconductor region. Even in a case where the ninth semiconductor region 9 is an N-type semiconductor region, at the position Z, the potential height of the dotted line 20 is higher than that of the solid line 21.

Figure 13:
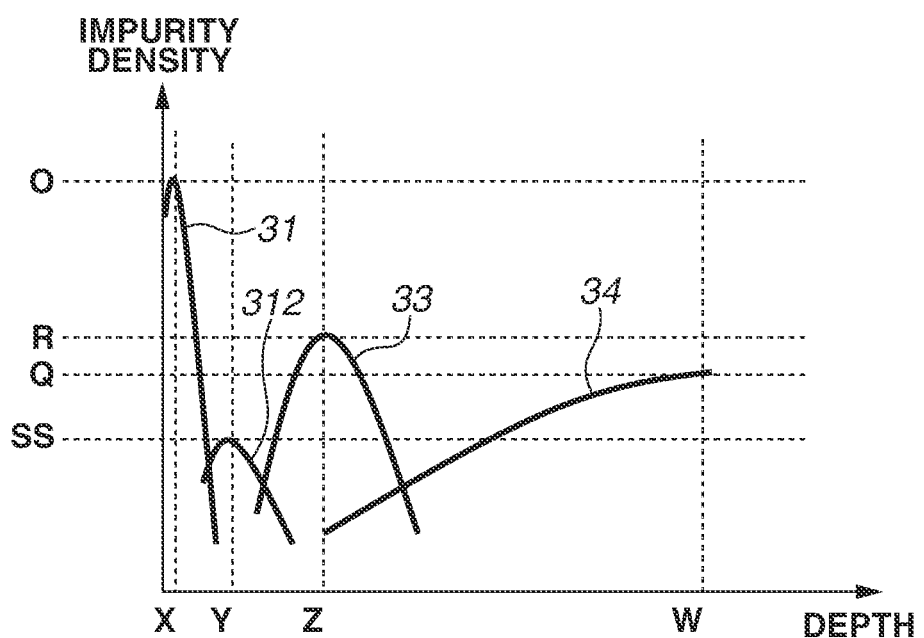
FIG. 13 illustrates impurity densities of the avalanche diode.

FIG. 13 illustrates impurity density distributions according to the present exemplary embodiment. More specifically, FIG. 13 illustrates examples of impurity density distributions taken along the line J-K in the cross-sectional view illustrated in FIG. 10. A line 31 illustrates the N-type impurity density distribution in the N-type semiconductor region 1 taken along the line J-K. A line 312 indicates the N-type impurity density distribution in the N-type semiconductor region 12 taken along the line J-K. A line 33 indicates the P-type impurity density distribution in the P-type semiconductor region 3 taken along the line J-K. A line 34 indicates the N-type impurity density distribution in the N-type semiconductor region 14 taken along the line J-K.

Referring to FIG. 13, the depths X, Y, Z, and W correspond to each depth illustrated in FIG. 10.

The impurity density at a level O indicates the peak value of the impurity density of the N-type semiconductor region 1. The impurity density at a level SS indicates the peak value of the impurity density of the N-type semiconductor region 12. The impurity density at a level R indicates the peak value of the impurity density of the P-type semiconductor region 3. The impurity density at a level Q indicates the peak value of the impurity density of the N-type semiconductor region 4.

The peak value SS of the impurity density of the N-type semiconductor region 12 is smaller than the peak value O of the impurity density of the N-type semiconductor region 1. For example, the impurity density of the N-type semiconductor region 1 is $1*10^{18}$ [atoms/(cm^3)] or more and $5*10^{19}$ [atoms/(cm^3)] or less. The impurity density of the N-type semiconductor region 12 is $1*10^{17}$ [atoms/(cm^3)] or more and $5*10^{17}$ [atoms/(cm^3)] or less.

According to the present exemplary embodiment, as described above, the N-type semiconductor region 12 having a lower impurity density than the N-type semiconductor region 1 is formed in the region between the N-type semiconductor region 1 and the P-type semiconductor region 3. This structure enables reducing the strong electric field generated between the N-type semiconductor region 1 and the P-type semiconductor region 3 in comparison with a case where the N-type semiconductor region 12 is not formed. More specifically, like the light detection apparatus 1010 according to the first exemplary embodiment, the light detection apparatus 1010 according to the present exemplary embodiment can reduce noise while preventing the rise of the operating voltage for the avalanche multiplication.

A light detection apparatus according to a fourth exemplary embodiment will be described below centering on differences from the light detection apparatus 1010 according to the third exemplary embodiment.

Figure 14:
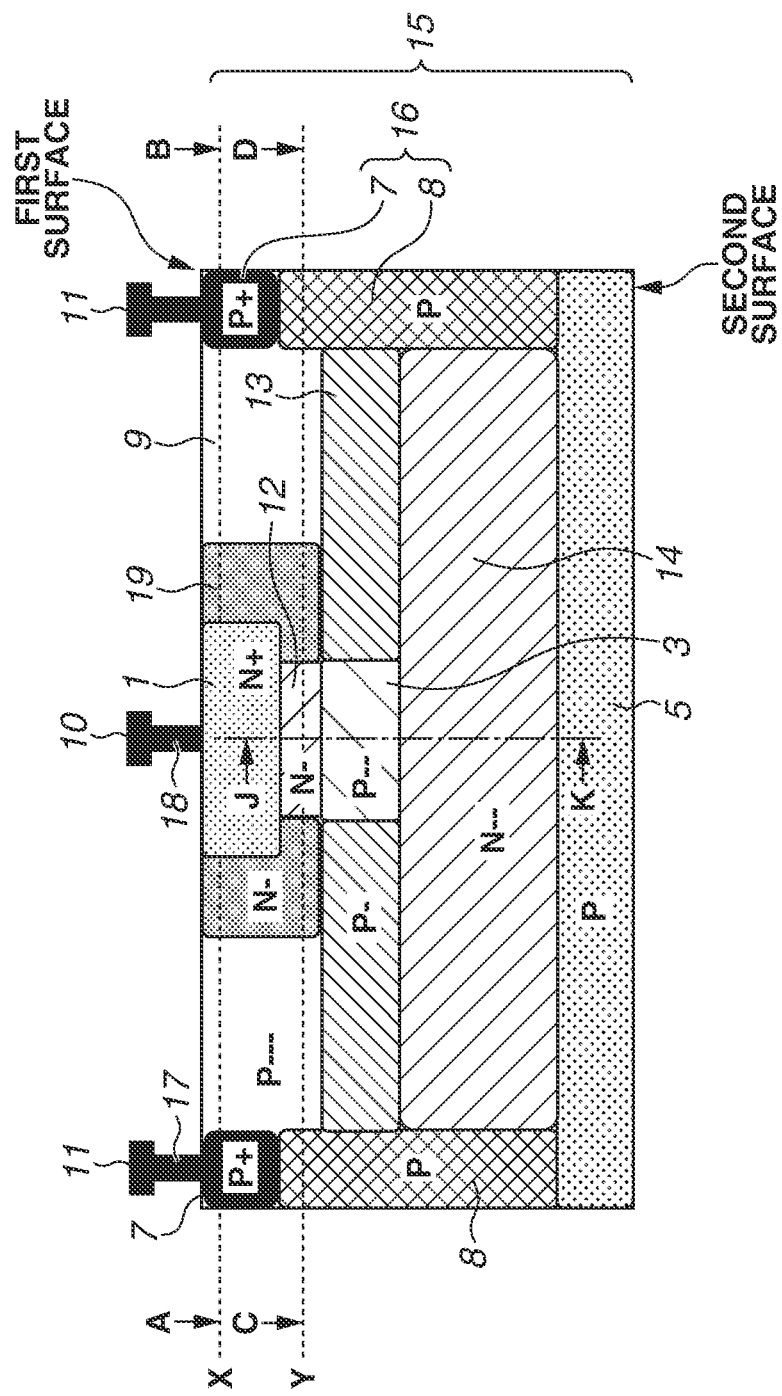
FIG. 14 is a cross-sectional view illustrating an avalanche diode.

FIG. 14 is a cross-sectional view schematically illustrating the avalanche diode according to the present exemplary embodiment. In FIG. 14, elements having a similar function to those illustrated in FIGS. 1 to 13 are assigned the same reference numerals, and detailed descriptions thereof will be omitted. The avalanche diode illustrated in FIG. 14 differs from the avalanche diode illustrated in FIG. 10 in that a twelfth semiconductor region (N-type semiconductor region) 19 of the first conductivity type is disposed in the region where the P-type semiconductor region 9 is disposed illustrated in FIG. 10.

In FIG. 14, a nineteenth semiconductor region (N-type semiconductor region) 19 of the first conductivity type is disposed in the region sandwiched between the separation portions 16.

In the first depth X, the N-type semiconductor region 1, the N-type semiconductor region 19, and the P-type semiconductor region 9 are disposed. The N-type semiconductor regions 1 and 19 are in contact with each other. The N-type semiconductor region 19 and the P-type semiconductor region 9 are in contact with each other. The P-type semiconductor region 9 is disposed between the N-type semiconductor region 19 and the separation portion 16.

In the second depth Y, the N-type semiconductor region 12, the N-type semiconductor region 19, and the P-type semiconductor region 9 are disposed. The N-type semiconductor regions 12 and 19 are in contact with each other. The N-type semiconductor region 19 and the P-type semiconductor region 9 are in contact with each other. The P-type semiconductor region 9 is disposed between the N-type semiconductor region 19 and the separation portion 16.

The N-type semiconductor region 1 has a higher impurity density than the N-type semiconductor region 19. Providing impurity densities in this way enables intensifying the electric field in the depletion layer generated in the N-type semiconductor region 1.

The impurity density of the N-type semiconductor region 19 is made lower than that of the N-type semiconductor region 1.

As described above, the N-type semiconductor region 19 having a lower impurity density than the N-type semiconductor region 1 is formed in the region between the N-type semiconductor region 1 and the P-type semiconductor region 9. This structure reduces the strong electric field generated between the N-type semiconductor region 1 and the P-type semiconductor region 9 in comparison with a case where the N-type semiconductor region 19 is not formed.

The N-type semiconductor region 19 can reduce the strong electric field generated between the N-type semiconductor region 1 and the P-type semiconductor region 13.

Although, in the structure illustrated in FIG. 14, the N-type semiconductor region 19 without an impurity density gradient is disposed, the N-type semiconductor region 19 preferably is a region having an impurity density gradient. By providing an impurity density gradient in the region between the N-type semiconductor region 1 and the P-type semiconductor region 9, the strong electric field generated between the N-type semiconductor region 1 and the P-type semiconductor region 9 is reduced in comparison with a case where the N-type semiconductor region 19 does not have an impurity density gradient.

In this way, the region between the N-type semiconductor region 1 and the P-type semiconductor region 9 is configured to have an impurity density gradient. This structure enables reducing the strong electric fields generated between the N-type semiconductor region 1 and the P-type semiconductor region 9 and between the N-type semiconductor region 1 and the P-type semiconductor region 13 in comparison with a case where the N-type semiconductor region 19 does not have an impurity density gradient.

The N-type semiconductor region 12 has a lower impurity density than the N-type semiconductor region 19. Providing impurity densities in this way enables making the electric field in the depletion layer generated between the N-type semiconductor region 1 and the P-type semiconductor region 3 more intense than the electric field in the depletion layer generated between the N-type semiconductor region 1 and the P-type semiconductor region 13. For example, the impurity density of the N-type semiconductor region 12 is $1*10^17$ [atoms/(cm$^3$)] or more and $5*10^17$ [atoms/(cm$^3$)] or less, and the impurity density of the N-type semiconductor region 19 is higher than that of the N-type semiconductor region 12. This structure enables reducing the strong electric field generated between the N-type semiconductor region 1 and the P-type semiconductor region 3 while reducing the strong electric field generated between the N-type semiconductor region 1 and the P-type semiconductor region 13.

Planar structures of the separation portion 16 and the photoelectric conversion region sandwiched between the separation portions 16 in an arbitrary depth in the cross-sectional structure illustrated in FIG. 14 will be described below with reference to the schematic plan views illustrated in FIGS. 15A and 15B.

Figure 15A:
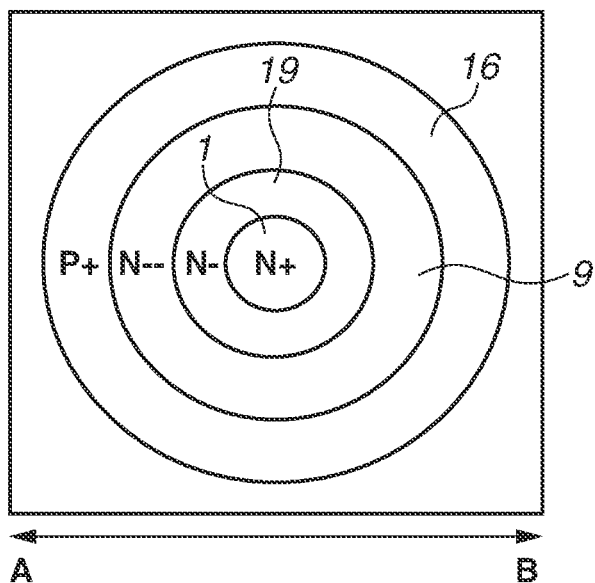
FIGS. 15A and 15B are top views illustrating the avalanche diode.

FIG. 15A is a schematic plan view taken along the line A-B in the first depth X illustrated in FIG. 14. FIG. 15B is a schematic plan view taken along the line C-D in the second depth Y illustrated in FIG. 14.

As illustrated in FIG. 15A, in the first depth X, the N-type semiconductor region 1 is enclosed in the N-type semiconductor region 19, the N-type semiconductor region 19 is enclosed in the P-type semiconductor region 9, and the P-type semiconductor region 9 is enclosed in the separation portion 16.

Figure 15B:
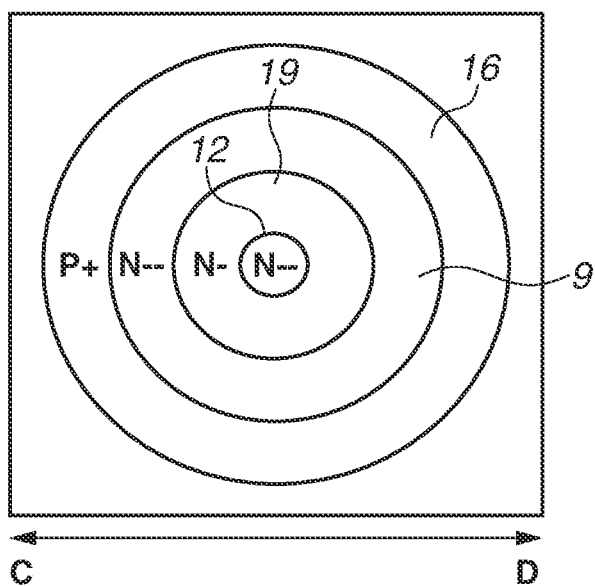

As illustrated in FIG. 15B, in the second depth Y, the N-type semiconductor region 12 is enclosed in the N-type semiconductor region 19, the N-type semiconductor region 19 is enclosed in the P-type semiconductor region 9, and the P-type semiconductor region 9 is enclosed in the separation portion 16.

As clearly illustrate in FIGS. 14, 15A, and 15B, in a plan view, at least a part of the N-type semiconductor region 1 overlaps with at least a part of the N-type semiconductor region 19, and the N-type semiconductor region 19 and the P-type semiconductor region 9 overlap with the P-type semiconductor region 13.

In the light detection apparatus 1010 according to the present exemplary embodiment, the N-type semiconductor region 19 having a lower impurity density than the N-type semiconductor region 1 and a higher impurity density than the N-type semiconductor region 12 is formed in the region between the N-type semiconductor region 1 and the P-type semiconductor region 9, as described above. This structure enables reducing the strong electric fields generated between the N-type semiconductor region 1 and the P-type semiconductor region 9 and between the N-type semiconductor region 1 and the P-type semiconductor region 13 in comparison with a case where the N-type semiconductor region 19 is not formed. This structure enables reducing noise generated by the strong electric fields generated between the N-type semiconductor region 1 and the P-type semiconductor region 9 and between the N-type semiconductor region 1 and the P-type semiconductor region 13.

A light detection apparatus according to a fifth exemplary embodiment will be described below centering on differences from the light detection apparatus 1010 according to the fourth exemplary embodiment.

FIG. 16 is a cross-sectional view schematically illustrating the avalanche diode according to the present exemplary embodiment. In FIG. 16, elements having a similar function to those illustrated in FIGS. 1 to 15B are assigned the same reference numerals, and detailed descriptions thereof will be omitted.

In the first depth X, the N-type semiconductor region 1, the N-type semiconductor region 12, and the P-type semiconductor region 9 are disposed. The N-type semiconductor regions 1 and 12 are in contact with each other. The N-type semiconductor region 12 and the P-type semiconductor region 9 are in contact with each other. The P-type semiconductor region 9 is disposed between the N-type semiconductor region 12 and the separation portion 16.

In the second depth Y, the N-type semiconductor region 12 and the P-type semiconductor region 9 are disposed. The N-type semiconductor region 12 and the P-type semiconductor region 9 are in contact with each other. The N-type semiconductor region 12 is disposed between the P-type semiconductor regions 9.

In this way, instead of the N-type semiconductor region 12, the P-type semiconductor region 9 is disposed in the region between the N-type semiconductor region 1 and the P-type semiconductor region 3. Providing such a structure enables making the electric field in the depletion layer generated between the N-type semiconductor region 1 and the P-type semiconductor region 3 more intense than the electric field in the depletion layer generated between the N-type semiconductor region 1 and the P-type semiconductor region 13.

Planar structures of the separation portion 16 and the photoelectric conversion region sandwiched between the separation portions 16 in an arbitrary depth in the cross-sectional structure illustrated in FIG. 16 will be described below with reference to the schematic plan views illustrated in FIGS. 17A and 17B.

Figure 17A:
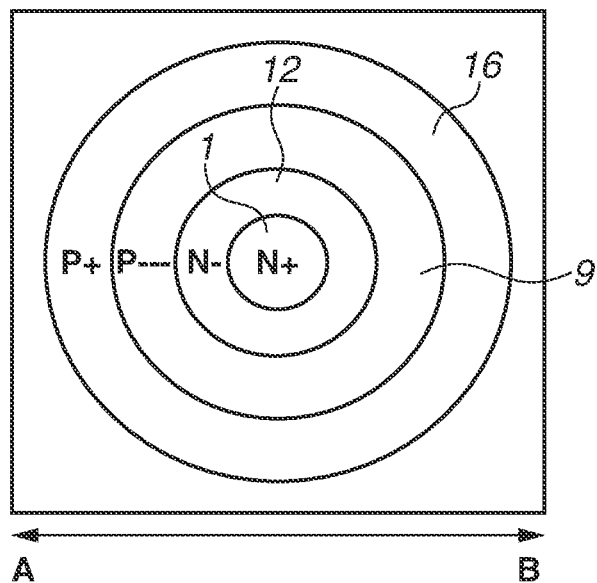
FIGS. 17A and 17B are top views illustrating the avalanche diode.

FIG. 17A is a schematic plan view taken along the line A-B in the first depth X illustrated in FIG. 16. FIG. 17B is a schematic plan view taken along the line C-D in the second depth Y illustrated in FIG. 16.

As illustrated in FIG. 17A, in the first depth X, the N-type semiconductor region 1 is enclosed in the N-type semiconductor region 12, and the N-type semiconductor region 12 is enclosed in the P-type semiconductor region 9.

Figure 17B:
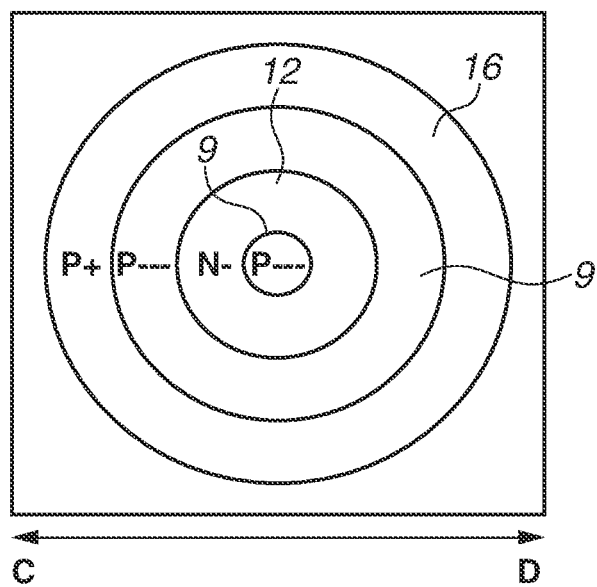

As illustrated in FIG. 17B, in the second depth Y, the N-type semiconductor region 12 is disposed between the P-type semiconductor regions 9.

As clearly illustrate in FIGS. 16, 17A, and 17B, in a plan view, the N-type semiconductor region 12 overlaps with at least a part of the P-type semiconductor region 13.

According to the present exemplary embodiment, as described above, instead of the N-type semiconductor region 12, the P-type semiconductor region 9 is formed in the region between the N-type semiconductor region 1 and the P-type semiconductor region 3. This structure enables reducing the strong electric fields generated between the N-type semiconductor region 1 and the P-type semiconductor region 13 and between the N-type semiconductor region 1 and the P-type semiconductor region 3 in comparison with a case where the N-type semiconductor region 12 is formed in the region between the N-type semiconductor region 1 and the P-type semiconductor region 3. More specifically, the light detection apparatus 1010 according to the present exemplary embodiment is capable of reducing noise while preventing the rise of the operating voltage for the avalanche multiplication.

A light detection apparatus according to a sixth exemplary embodiment will be described below centering on differences from the light detection apparatus 1010 according to the fifth exemplary embodiment.

Figure 18:
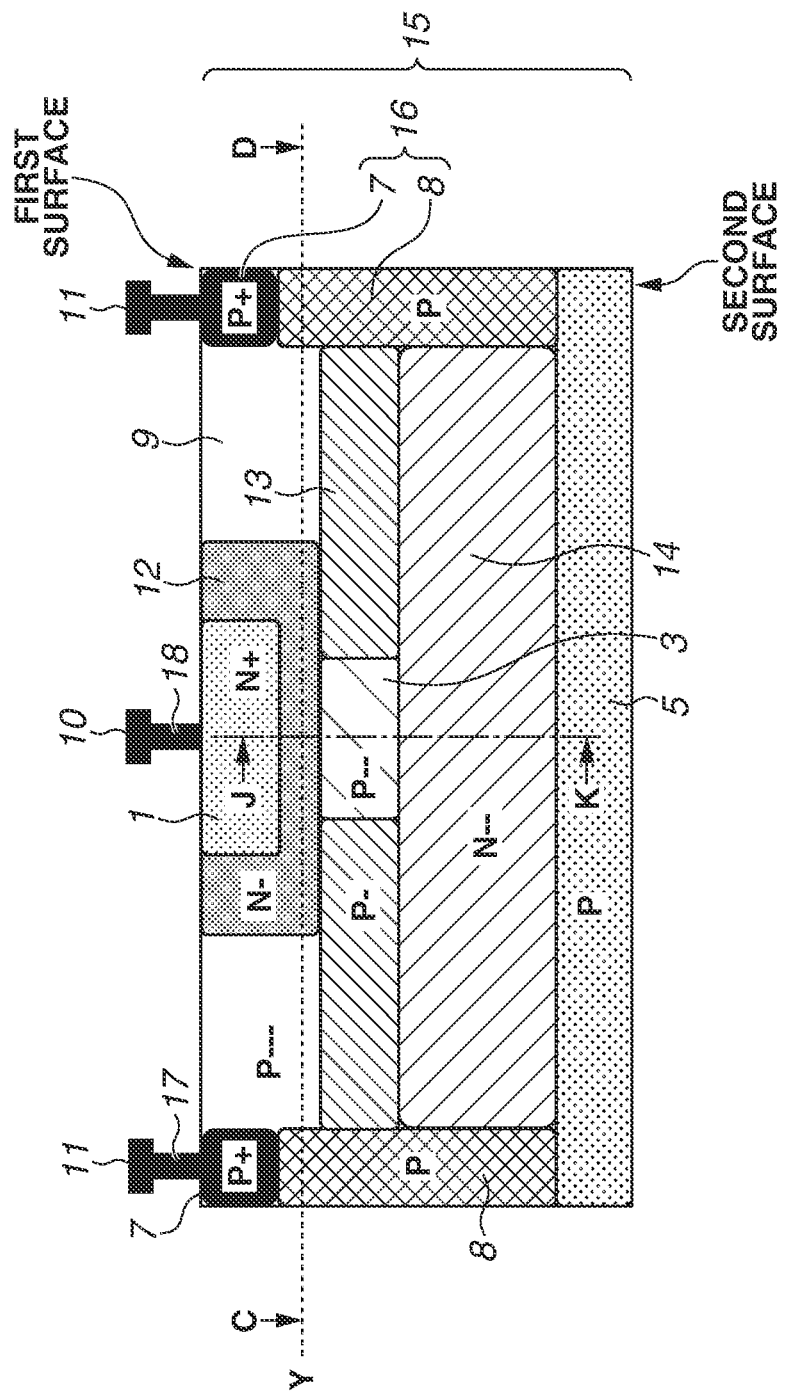
FIG. 18 is a cross-sectional view illustrating an avalanche diode.

FIG. 18 is a cross-sectional view schematically illustrating the avalanche diode according to the present exemplary embodiment. In FIG. 18, elements having a similar function to those illustrated in FIGS. 1 to 17B are assigned the same reference numerals, and detailed descriptions thereof will be omitted.

In the second depth Y, the N-type semiconductor region 12 and the P-type semiconductor region 9 are disposed. The N-type semiconductor region 12 and the P-type semiconductor region 9 are in contact with each other. The P-type semiconductor region 9 is disposed between the N-type semiconductor region 12 and the separation portion 16.

Planar structures of the separation portion 16 and the photoelectric conversion region sandwiched between the separation portions 16 in an arbitrary depth in the cross-sectional structure illustrated in FIG. 18 will be described below with reference to the schematic plan views illustrated in FIG. 19.

Figure 19:
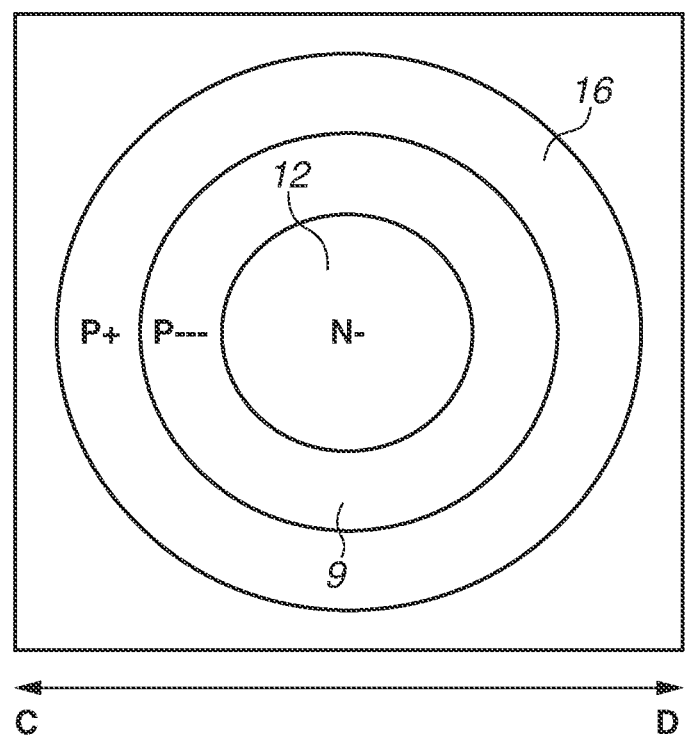
FIG. 19 is a top view illustrating the avalanche diode.

FIG. 19 is a schematic plan view taken along the line C-D in the second depth Y illustrated in FIG. 18.

As illustrated in FIG. 19, in the second depth Y, the N-type semiconductor region 12 is disposed between the P-type semiconductor regions 9.

As clearly illustrate in from FIGS. 18 and 19, in a plan view, the N-type semiconductor region 1 overlaps with at least a part of the N-type semiconductor region 12, and the N-type semiconductor region 12 overlaps with at least a part of the P-type semiconductor region 13.

In this structure in which the N-type semiconductor region 1 overlaps with at least a part of the N-type semiconductor region 12, and the N-type semiconductor region 12 overlaps with at least a part of the P-type semiconductor region 13, the strong electric field generated between the N-type semiconductor region 1 and the P-type semiconductor region 13 can be reduced.

According to the present exemplary embodiment, as described above, the N-type semiconductor region 1 overlaps with at least a part of the N-type semiconductor region 12, and the N-type semiconductor region 12 overlaps with at least a part of the P-type semiconductor region 13. This structure enables reducing the strong electric field generated between the N-type semiconductor region 1 and the P-type semiconductor region 13. Thus, noise can be reduced while preventing the rise of the operating voltage required for the avalanche multiplication.

A light detection apparatus according to a seventh exemplary embodiment will be described below centering on differences from the light detection apparatus 1010 according to the third exemplary embodiment.

The present exemplary embodiment will be described below with reference to FIG. 10.

According to the present exemplary embodiment, the impurity density is equalized for the P-type semiconductor regions 3 and 13 disposed in the third depth Z illustrated in FIG. 10.

Accordingly, forming the P-type semiconductor regions 3 and 13 by using the same mask enables preventing characteristic fluctuations due to manufacturing variations.

An eighth exemplary embodiment will be described below centering on a method for manufacturing the light detection apparatus 1010 according to the first exemplary embodiment.

FIGS. 20A to 20C, 21A, and 21B illustrate a method for manufacturing the light detection apparatus 1010 according to the first exemplary embodiment.

Figure 20A:
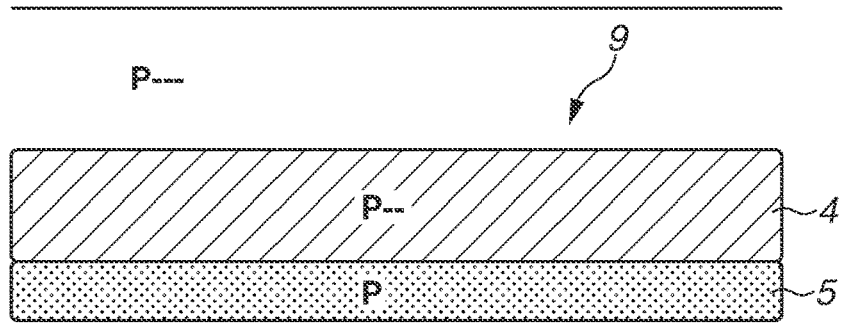
FIGS. 20A, 20B, and 20C illustrate a method for manufacturing an avalanche diode.

Referring to FIG. 20A, the P-type semiconductor regions 4 and 5 are formed in the P-type semiconductor region 9 by performing the ion implantation of an impurity (such as boron). When forming the P-type semiconductor region 5, the impurity implantation condition is set such that the amount and the depth of ion implantation are increased in comparison with a case where the P-type semiconductor region 4 is formed.

Figure 20B:
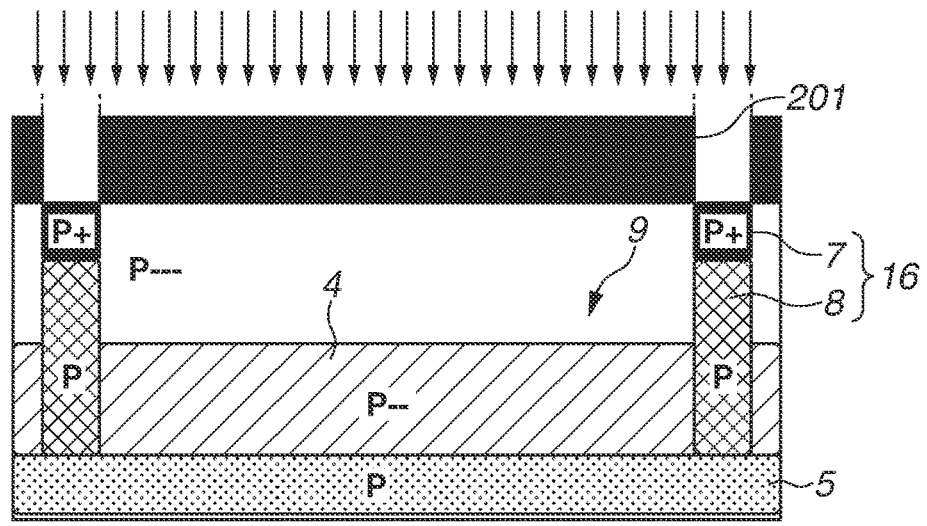

Referring to FIG. 20B, a resist pattern 201 is formed by patterning a resist applied to the semiconductor substrate. The ion implantation of an impurity (such as boron) is performed by using this resist pattern 201. Thus, the P-type semiconductor regions 7 and 8 are formed. When forming the P-type semiconductor region 7, the impurity implantation condition is set such that the amount of ion implantation is increased and the depth of ion plantation is decreased in comparison with a case where the P-type semiconductor region 8 is formed. The P-type semiconductor regions 7 and 8 are formed by using the same resist pattern 201.

Figure 20C:
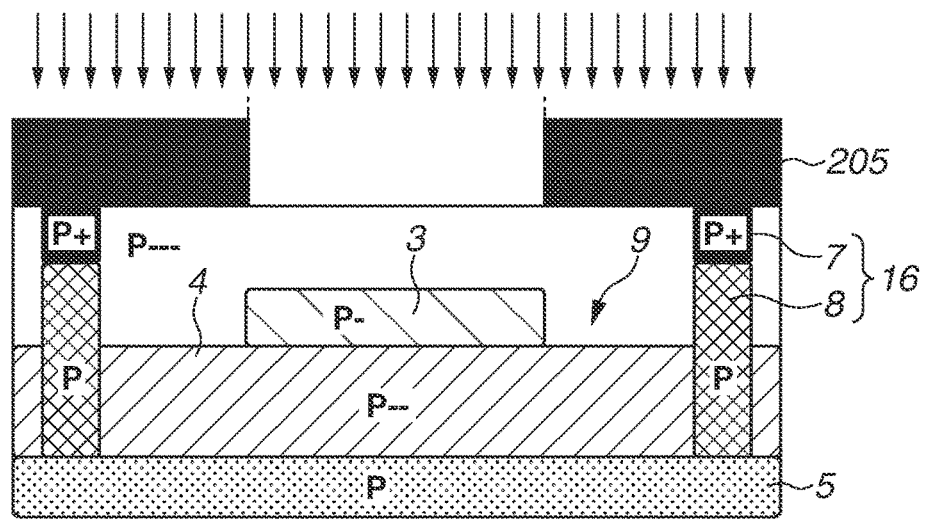

Referring to FIG. 20C, a resist pattern 205 is formed by patterning a resist applied to the semiconductor substrate. The ion implantation of an impurity (such as boron) is performed by using this resist pattern 205. Thus, the P-type semiconductor region 3 is formed. When forming P-type semiconductor region 3, the impurity implantation condition is set such that the amount of ion implantation is increased and the depth of ion plantation is decreased in comparison with a case where the P-type semiconductor region 4 is formed.

Figure 21A:
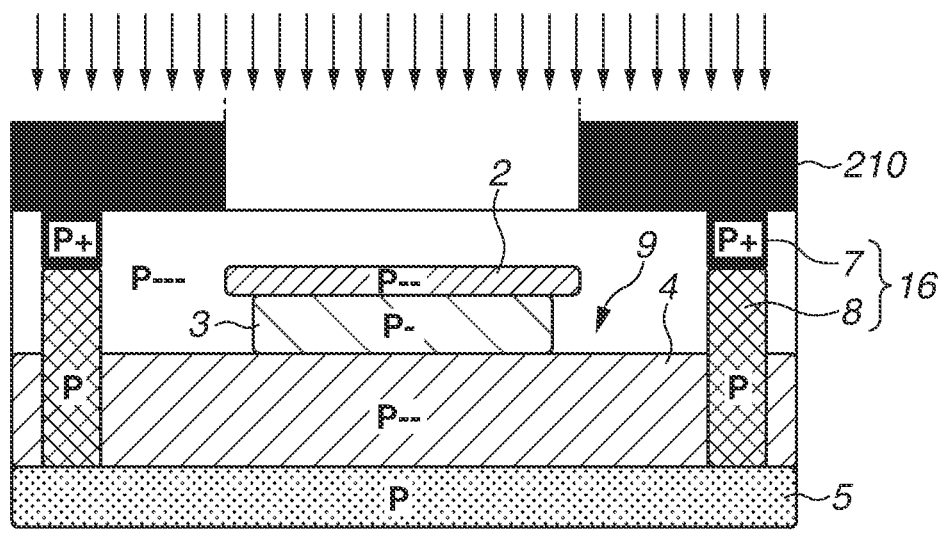
FIGS. 21A and 21B illustrate the method for manufacturing the avalanche diode.

Referring to FIG. 21A, a resist pattern 210 is formed by patterning a resist applied to the semiconductor substrate. The ion implantation of an impurity (such as boron) is performed by using this resist pattern 210. Thus, the P-type semiconductor region 2 is formed. When forming P-type semiconductor region 2, the impurity implantation condition is set such that the amount and the depth of ion implantation are decreased in comparison with a case where the P-type semiconductor region 3 is formed.

Figure 21B:
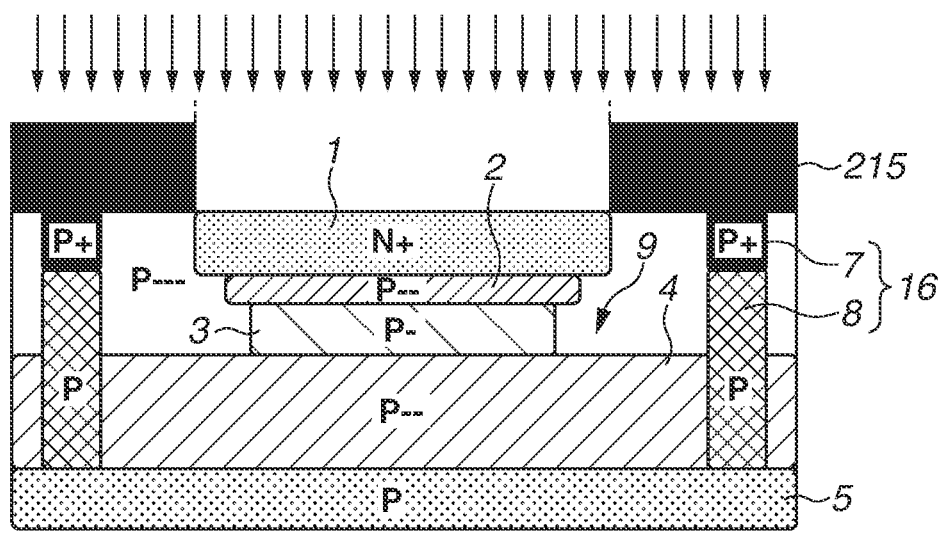

Referring to FIG. 21B, a resist pattern 215 is formed by patterning a resist applied to the semiconductor substrate. The ion implantation of impurity (such as phosphor and arsenic) is performed by using this resist pattern 215. Thus, the N-type semiconductor region 1 is formed.

The light detection apparatus 1010 according to the first exemplary embodiment can be configured in this way.

The light detection apparatuses 1010 according to the first to eighth exemplary embodiments are applicable to both a front surface irradiation type in which light is incident on the first surface and a rear surface irradiation type in which light is incident on the second surface.

A ninth exemplary embodiment will be described below centering on an example of a light detection system using the light detection apparatus 1010 according to each exemplary embodiment. As examples of a light detection system, an invisible light detection system and a medical diagnostic system such as a positron-emission tomography (PET) will be described below with reference to FIG. 22.

The pixel 100 according to the present exemplary embodiment includes a TDC and a memory instead of the counter circuit 204 illustrated in FIG. 2. In the following descriptions, the pixel 100 includes a TDC 204 and a memory 205.

Figure 22:
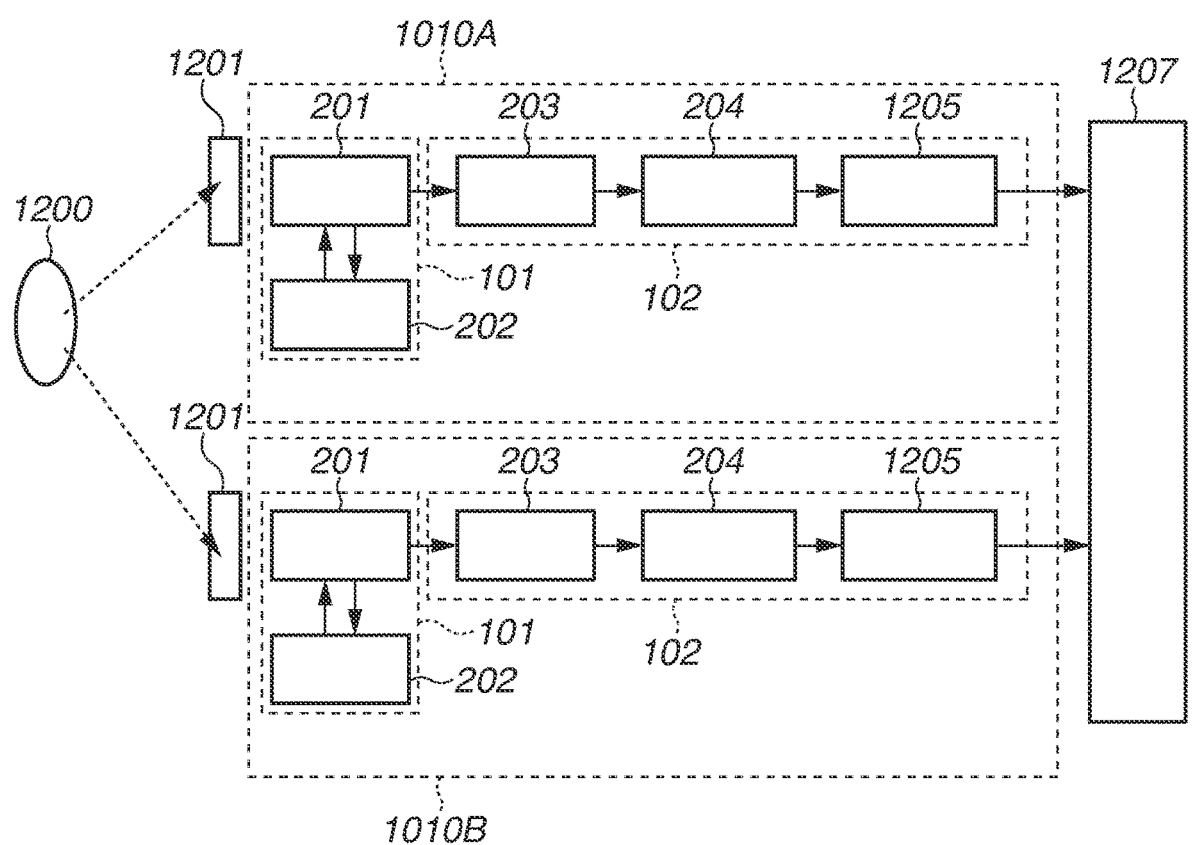
FIG. 22 illustrates an example of a configuration of a photoelectric conversion system.

FIG. 22 is a block diagram illustrating a configuration of an invisible light detection system. The invisible light detection system includes a wavelength conversion unit 1201, a data processing unit 1207, and a plurality of the light detection apparatuses 1010.

An irradiation object 1200 irradiates the wavelength conversion units 1201 with light having the wavelength band of invisible light. The wavelength conversion units 1201 receive light having the wavelength band of invisible light emitted from the irradiation object 1200 and emits visible light.

Upon incidence of visible light emitted from the wavelength conversion unit 1201, the photoelectric conversion portion 201 performs photoelectric conversion. In each of the light detection apparatuses 1010, a digital signal based on a signal based on electric charges after the photoelectric conversion is stored in the memory 205 via the control portion 202, the waveform shaping portion 203, and the TDC 204. The plurality of the light detection apparatuses 1010 may be formed as a single apparatus or formed of an arrangement of a plurality of apparatuses.

A plurality of digital signals stored in the memories 205 of the plurality of the light detection apparatuses 1010 is subjected to signal processing by the data processing unit 1207. In this case, as a signal processing unit, the data processing unit 1207 performs combination processing on a plurality of images obtained from the plurality of digital signals.

As a specific example of an invisible light detection system, a configuration of a medical diagnostic system such as a PET will be described below.

A subject as the irradiation object 1200 emits a radiation pair from the living body. The wavelength conversion unit 1201 forms a scintillator which emits visible light upon incidence of a radiation pair emitted from the subject.

Upon incidence of visible light emitted from the scintillator, the photoelectric conversion portion 201 performs photoelectric conversion. In each of the light detection apparatuses 1010, a digital signal based on a signal based on electric charges after the photoelectric conversion is stored in the memory 205 via the control portion 202, the waveform shaping portion 203, and the TDC 204. More specifically, each of the light detection apparatuses 1010 is disposed to detect the arrival time of the radiation pair emitted from the subject, detects the visible light emitted from the scintillator, and stores a digital signal in the memory 205.

A plurality of digital signals stored in the memories 205 of the plurality of the light detection apparatuses 1010 is subjected to signal processing by the data processing unit 1207. In this case, as a signal processing unit, the data processing unit 1207 performs combination processing such as image reconstruction on a plurality of images obtained from the plurality of digital signals to form an image of the inside of the subject's living body.

A tenth exemplary embodiment will be described below centering on an example of a light detection system using the light detection apparatus 1010 according to each exemplary embodiment.

Figure 23:
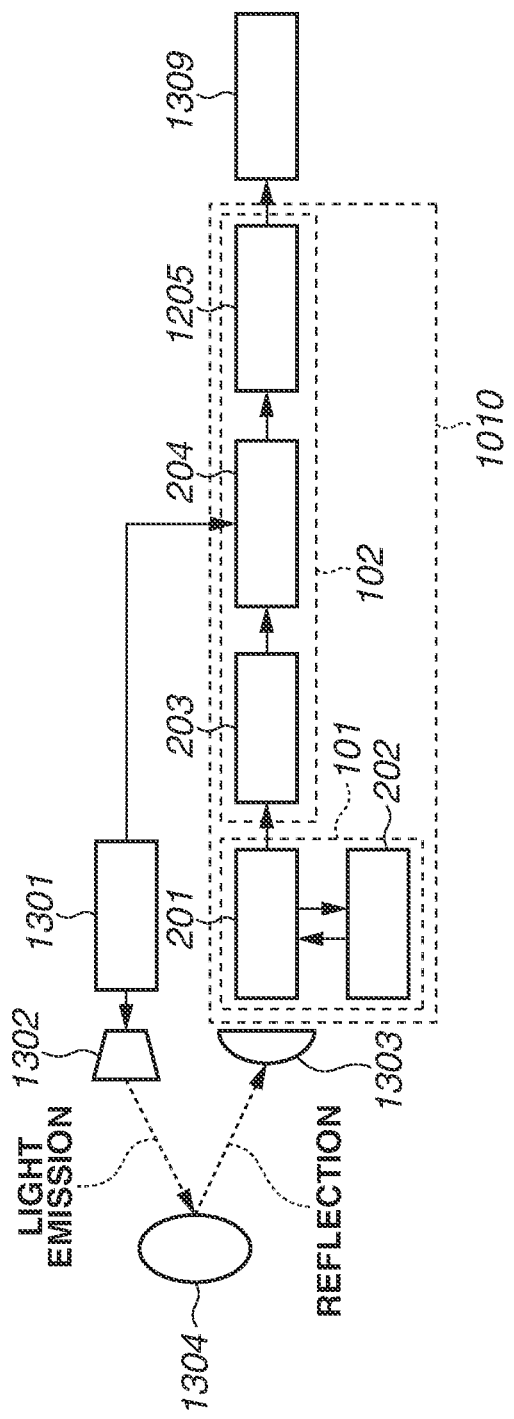
FIG. 23 illustrates another example of a configuration of the photoelectric conversion system.

FIG. 23 illustrates a distance detection system as an example of a light detection system. The pixel 100 according to the present exemplary embodiment includes the TDC and the memory according to the first exemplary embodiment instead of the counter circuit 204 illustrated in FIG. 2. In the following descriptions, the pixel 100 includes a TDC 204 and a memory 205 instead of the counter circuit 204.

An example of a block diagram illustrating a distance detection system according to the present exemplary embodiment will be described below with reference to FIG. 23. The distance detection system includes a light source control unit 1301, a light emitting unit 1302, an optical member 1303, a light detection apparatus 1010, and a distance calculation unit 1309.

The light source control unit 1301 controls the drive of the light emitting unit 1302. Upon reception of a signal from the light source control unit 1301, the light emitting unit 1302 emits short pulse (train) light in the imaging direction.

The light emitted from the light emitting unit 1302 is reflected by a subject 1304. The reflected light passes through the optical member 1303 and then is received by the photoelectric conversion portion 201 of the light detection apparatus 1010. Then, a signal based on electric charges after the photoelectric conversion by the photoelectric conversion portion 201 is input to the TDC 204 via the waveform shaping portion 203.

The TDC 204 compares a signal acquired from the light source control unit 1301 with a signal input from the waveform shaping portion 203. The TDC 204 performs high-accuracy digital conversion on the time period since the time when the light emitting unit 1302 emits pulsed light till the time when the optical member 1303 receives light reflected by the subject 1304. The digital signal output from the TDC 204 is stored in the memory 1205.

The distance calculation unit 1309 calculates the distance from the light detection apparatus 1010 to the subject based on digital signals for a plurality of measurements stored in the memory 1205. This distance detection system is applicable, for example, as an on-board system.

Figure 24A:
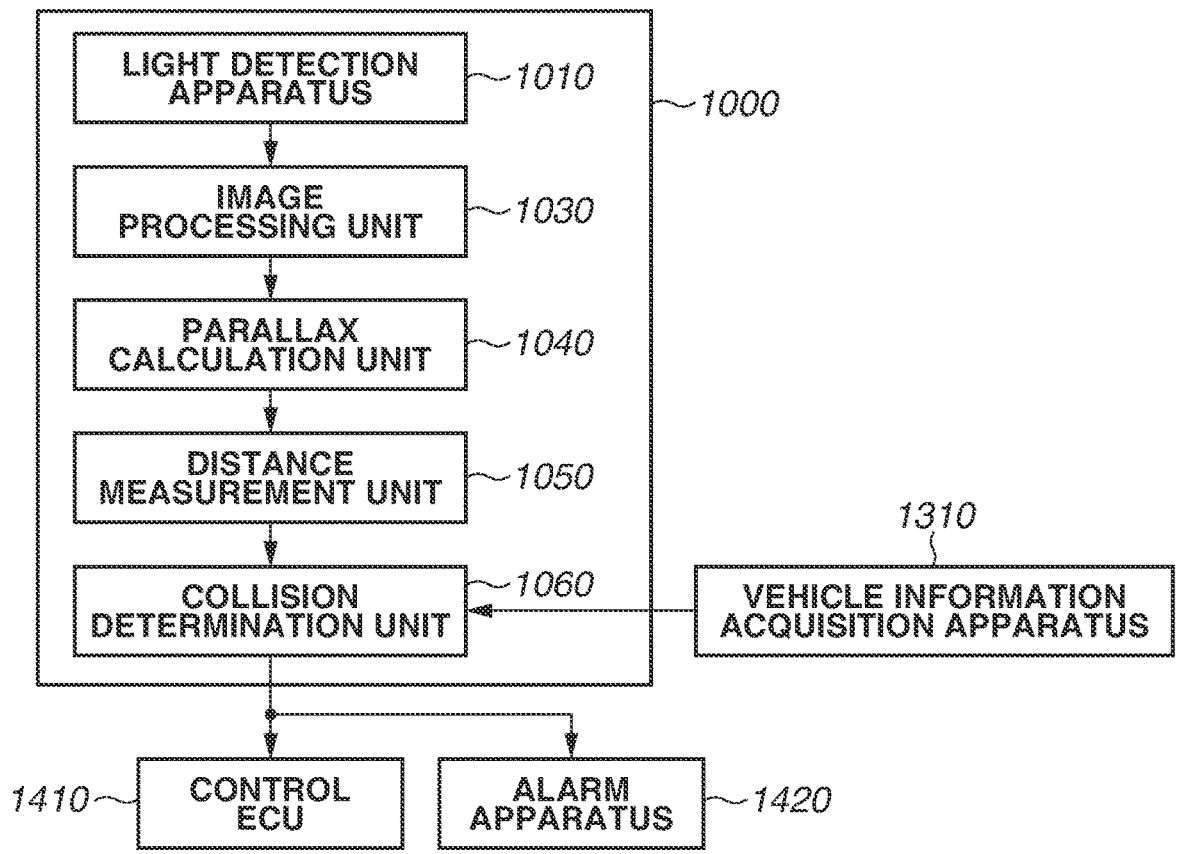
FIGS. 24A and 24B illustrate an example of a configuration of a moving body.
Figure 24B:
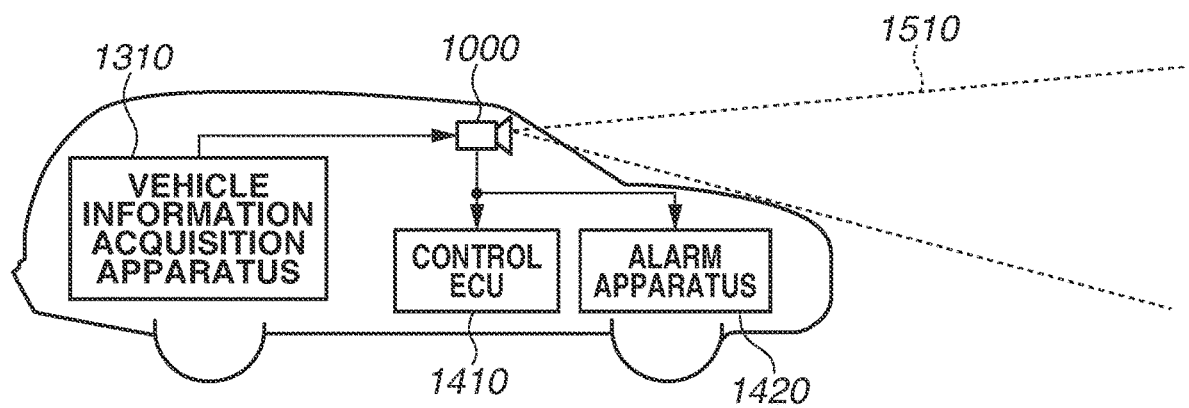

An example of a light detection system using the counter circuit 204 illustrated in FIG. 2 will be described below with reference to FIGS. 24A and 24B. FIGS. 24A and 24B illustrate a light detection system related to an on-vehicle camera as an example of a light detection system.

A light detection system 1000 is a light detection system including distance measurement pixels and photographing pixels according to the present disclosure. The light detection system 1000 includes an image processing unit 1030 for performing image processing on a plurality of digital signals acquired by the light detection apparatus 1010. The light detection system 1000 also includes a parallax calculation unit 1040 for calculating the parallax (parallax image phase difference) from a plurality of pieces of image data acquired by the image processing unit 1030.

The light detection system 1000 also includes a distance measurement unit 1050 for calculating the distance to a subject based on the calculated parallax, and a collision determination unit 1060 for determining whether there is a possibility of collision based on the calculated distance. The parallax calculation unit 1040 and the distance measurement unit 1050 are examples of distance information acquisition units for acquiring information about the distance to the subject. More specifically, the distance information is information about the parallax, the defocus amount, and the distance to the subject.

The collision determination unit 1060 may determine the possibility of collision by using any one of these pieces of the distance information. The distance information acquisition units may be implemented by a specially designed hardware module, a software module, or a combination of both, or may be implemented by a field programmable gate array (FPGA), an application specific integrated circuit (ASIC), or a combination of both.

The light detection system 1000 connected with a vehicle information acquisition apparatus 1310 is capable of acquiring vehicle information including the vehicle speed, yaw rate, and steering angle. The light detection system 1000 is also connected with a control Electronic Control Unit (ECU) 1410 as a control apparatus for outputting a control signal for generating a braking force to the vehicle based on the determination result by the collision determination unit 1060.

The light detection system 1000 is also connected with an alarm apparatus 1420 for generating an alarm to the driver based on the determination result by the collision determination unit 1060. For example, when the possibility of collision is determined to be high based on the determination result by the collision determination unit 1060, the control ECU 1410 performs vehicle control for avoiding a collision and reducing damages by applying the brake, releasing the accelerator, and restraining the engine power. The alarm apparatus 1420 warns the user by generating an alarm sound, displaying alarm information on a screen such as a car navigation system, or applying vibrations to the seat belt and steering wheel.

According to the present exemplary embodiment, the light detection system 1000 captures images of the surrounding of the vehicle, e.g., images ahead or behind the vehicle. FIG. 24B illustrates the light detection system 1000 in a case where images ahead of the vehicle are to be captured. Although the present exemplary embodiment has been described above centering on control for avoiding a collision with other vehicles, it is also applicable to automatic driving control for following another vehicle and automatic driving control for retaining the vehicle within the lane. The light detection system 1000 is applicable not only to vehicles but also to vessels, airplanes, industrial robots, and other moving objects (moving apparatuses). In addition, the light detection system 1000 is applicable not only to moving objects but also to intelligent transport systems (ITS's) and a wide range of apparatuses utilizing object recognition.

The present disclosure provides a light detection apparatus capable of reducing noise while preventing the rise of the operating voltage for the avalanche multiplication, and a photoelectric conversion system.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-185431, filed Sep. 28, 2018, which is hereby incorporated by reference herein in its entirety.

What is claimed is:

1. A light detection apparatus comprising:
a semiconductor substrate having a first surface, and having a second surface facing the first surface; and
a pixel unit including a plurality of pixels disposed on the semiconductor substrate, each pixel including an avalanche diode, a first separation portion and a second separation portion,
wherein the avalanche diode comprises:
a first semiconductor region of a first conductivity type disposed in a first depth;
a second semiconductor region disposed in a second depth deeper than the first depth with respect to the first surface, in contact with the first semiconductor region;

a third semiconductor region disposed in a third depth deeper than the second depth with respect to the first surface, in contact with the second semiconductor region; and a fourth semiconductor region disposed in a fourth depth deeper than the third depth with respect to the first surface, in contact with the third semiconductor region, wherein the avalanche diode causes avalanche multiplication by the first and third semiconductor regions, wherein the first, second, third, and fourth semiconductor regions have overlapped portions in a plan view, wherein a difference in potential height between the first and second semiconductor regions with respect to main carrier electric charges of a semiconductor region of the first conductive type is smaller than a difference in potential height between the first and third semiconductor regions with respect to the carrier electric charges, wherein a potential height of the fourth semiconductor region with respect to the carrier electric charges is lower than a potential height of the third semiconductor region with respect to the carrier electric charge, wherein the first separation portion and the second separation portion are disposed in the first to fourth depths, wherein the avalanche diode is disposed between the first and second separation portions in the plan view, wherein the first and second separation portions are connected to a contact plug applied with a predetermined potential, and wherein the fourth semiconductor region is in contact with the first and second separation portions and applied with a potential based on the predetermined potential by the first and second separation portions.

2. The light detection apparatus according to claim 1, further comprising, in the first depth, a sixth semiconductor region of the first conductivity type in a region in contact with the first semiconductor region, between the first semiconductor region and the first separation portion, the sixth semiconductor region having a larger potential height with respect to the carrier electric charges than the first semiconductor region.

3. The light detection apparatus according to claim 2, wherein the sixth semiconductor region is disposed from a side portion to a bottom of the first semiconductor region.

4. The light detection apparatus according to claim 2, further comprising a seventh semiconductor region in the third depth, in contact with the third semiconductor region and the first separation portion, the seventh semiconductor region having a higher potential with respect to the carrier electric charges than the third semiconductor region.

5. The light detection apparatus according to claim 4, further comprising a fifth semiconductor region disposed in a fifth depth deeper than the fourth depth with respect to the first surface, in contact with the fourth semiconductor region, wherein the fifth semiconductor region is in contact with the first and second separation portions.

6. The light detection apparatus according to claim 2, further comprising a fifth semiconductor region disposed in a fifth depth deeper than the fourth depth with respect to the first surface, in contact with the fourth semiconductor region, wherein the fifth semiconductor region is in contact with the first and second separation portions.

7. The light detection apparatus according to claim 1, further comprising a fifth semiconductor region disposed in a fifth depth deeper than the fourth depth with respect to the first surface, in contact with the fourth semiconductor region, wherein the fifth semiconductor region is in contact with the first and second separation portions.

8. The light detection apparatus according to claim 7, wherein the potential height of the fourth semiconductor region with respect to the carrier electric charges is lower than the potential height of the fifth semiconductor region with respect to the carrier electric charges.

9. The light detection apparatus according to claim 1, wherein, in the fourth semiconductor region, the potential height with respect to the carrier electric charges decreases from the second surface to the first surface.

10. A light detection system including a plurality of the light detection apparatuses according to claim 1, the light detection system comprising:
 a wavelength conversion unit configured to convert light in a first wavelength band into light in a second wavelength band different from the first wavelength band; and
 a signal processing unit configured to perform processing for combining a plurality of images obtained from a plurality of digital signals stored in the plurality of light detection apparatuses,
 wherein the light in the second wavelength band output from the wavelength conversion unit is incident to the plurality of light detection apparatuses.

11. The light detection system including a plurality of the light detection apparatuses according to claim 1, the light detection system comprising:
 a light emitting unit configured to emit light to be detected by the light detection apparatus, and
 a distance calculation unit configured to perform distance calculation by using digital signals stored in the light detection apparatus.

12. An apparatus comprising:
 the light detection apparatus according to claim 1;
 a distance information acquisition unit configured to acquire information about a distance to a subject based on a parallax image based on a signal from the light detection apparatus; and
 a control unit configured to control movement of the apparatus based on the distance information.

* * * * *